US010028366B2

(12) United States Patent
Hori et al.

(10) Patent No.: US 10,028,366 B2
(45) Date of Patent: Jul. 17, 2018

(54) EXTREME UV LIGHT GENERATION DEVICE AND TARGET RECOVERY APPARATUS

(71) Applicant: Gigaphoton Inc., Tochigi (JP)

(72) Inventors: Tsukasa Hori, Oyama (JP); Fumio Iwamoto, Oyama (JP); Kazukiyo Kamikanna, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 15/645,295

(22) Filed: Jul. 10, 2017

(65) Prior Publication Data
US 2017/0307979 A1 Oct. 26, 2017

Related U.S. Application Data

(63) Continuation of application No. PCT/JP2015/055671, filed on Feb. 26, 2015.

(51) Int. Cl.
H05G 2/00 (2006.01)
G03F 7/20 (2006.01)

(52) U.S. Cl.
CPC ........... H05G 2/008 (2013.01); G03F 7/2002 (2013.01); H05G 2/003 (2013.01)

(58) Field of Classification Search
CPC ....... H05G 2/003; H05G 2/008; G03F 7/2002
See application file for complete search history.

(56) References Cited

U.S. PATENT DOCUMENTS

| 4,915,729 | A | 4/1990 | Boswell et al. |
| 2010/0025231 | A1 | 2/2010 | Moriya et al. |
| 2010/0258748 | A1 | 10/2010 | Vaschenko et al. |
| 2012/0119116 | A1 | 5/2012 | Kakizaki et al. |

(Continued)

FOREIGN PATENT DOCUMENTS

| JP | S62-502478 A | 9/1987 |
| JP | H09-030876 A | 2/1997 |

(Continued)

OTHER PUBLICATIONS

International Search Report issued in PCT/JP2015/055671, dated May 19, 2015.

(Continued)

*Primary Examiner* — Wyatt Stoffa
*Assistant Examiner* — Eliza Osenbaugh-Stewar
(74) *Attorney, Agent, or Firm* — Studebaker & Brackett PC

(57) ABSTRACT

An EUV light generation device generates EUV light stably. The EUV light generation device may include a chamber in which extreme ultraviolet light is generated when a target is irradiated with laser light in a predetermined region inside the chamber, a target supply device configured to output the target to the predetermined region in the chamber to thereby supply the target to the predetermined region, and a target recovery apparatus configured to recover the target output from the target supply device and not irradiated with the laser light. The target recovery apparatus may include a receiver disposed to be inclined with respect to a trajectory of the target output from the target supply device, the receiver being configured to receive the target by allowing the target not irradiated with the laser light to collide with the receiver, and an excitation device configured to vibrate the receiver.

11 Claims, 27 Drawing Sheets

(56) References Cited

U.S. PATENT DOCUMENTS

| | | | |
|---|---|---|---|
| 2012/0248343 A1* | 10/2012 | Nagai | H05G 2/003 250/504 R |
| 2012/0298134 A1 | 11/2012 | Moriya et al. | |
| 2013/0256567 A1 | 10/2013 | Kakizaki et al. | |
| 2014/0160453 A1* | 6/2014 | Kempen | H05G 2/003 355/53 |
| 2016/0192470 A1 | 6/2016 | Iwamoto et al. | |
| 2016/0255709 A1 | 9/2016 | Iwamoto et al. | |

FOREIGN PATENT DOCUMENTS

| | | |
|---|---|---|
| JP | 2000-219921 A | 8/2000 |
| JP | 2008-226462 A | 9/2008 |
| JP | 2008-277529 A | 11/2008 |
| JP | 2012-146682 A | 8/2012 |
| WO | 2010/147214 A1 | 12/2010 |
| WO | 2015/063825 A1 | 5/2015 |
| WO | 2015/097888 A1 | 7/2015 |

OTHER PUBLICATIONS

International Preliminary Report on Patentability and Written Opinion issued in PCT/JP2015/055671, dated Aug. 29, 2017.

* cited by examiner

EXTREME UV LIGHT GENERATION DEVICE AND TARGET RECOVERY APPARATUS

CROSS-REFERENCE TO RELATED APPLICATIONS

The present application is a continuation application of International Application No. PCT/JP2015/055671 filed on Feb. 26, 2015. The content of the application is incorporated herein by reference in its entirety.

BACKGROUND

1. Technical Field

The present disclosure relates to an extreme ultraviolet light generation device and a target recovery apparatus.

2. Related Art

In Recent years, along with miniaturization of a semiconductor process, miniaturization of a transfer pattern in photolithography of a semiconductor process has been developed rapidly. In the next generation, fine processing of 70 nm to 45 nm, moreover, fine processing of 32 nm or thinner will be demanded. In order to respond to a demand for fine processing of 32 nm or thinner, for example, it is expected to develop an exposure device in which an extreme ultraviolet (EUV) light generation device configured to generate extreme ultraviolet (EUV) light having a wavelength of about 13 nm and reduced projection reflective optics are combined.

As EUV light generation devices, three types of devices are proposed, namely an LPP (Laser Produced Plasma) type device using plasma generated by radiating laser light to a target, a DPP (Discharge Produced Plasma) type device using plasma generated by electric discharge, and an SR (Synchrotron Radiation) type device using orbital radiation light.

CITATION LIST

Patent Literature

Patent Literature 1: Japanese Patent Application Laid-Open No. 2000-219921
Patent Literature 2: Japanese Patent Application Laid-Open No. 2008-226462
Patent Literature 3: Japanese Patent Application Laid-Open No. 2012-146682
Patent Literature 4: Japanese National Publication of International Patent Application No. 62-502478
Patent Literature 5: U.S. Patent Application Publication No. 2010/0258748
Patent Literature 6: International Application No. PCT/JP2013/079092
Patent Literature 7: International Application No. PCT/JP2013/085184

SUMMARY

An extreme ultraviolet light generation device according to one aspect of the present disclosure may include a chamber, a target supply device, and a target recovery apparatus. In the chamber, extreme ultraviolet light may be generated when a target is irradiated with laser light in a predetermined region inside the chamber. The target supply device may be configured to output the target to the predetermined region in the chamber to thereby supply the target to the predetermined region. The target recovery apparatus may be configured to recover the target output from the target supply device and not irradiated with the laser light. The target recovery apparatus may include a receiver and an excitation device. The receiver may be disposed to be inclined with respect to a trajectory of the target output from the target supply device, and configured to receive the target by allowing the target not irradiated with the laser light to collide with the receiver. The excitation device may be configured to vibrate the receiver.

A target recovery apparatus according to one aspect of the present disclosure may include a receiver and an excitation device. The receiver may be disposed to be inclined with respect to a trajectory of the target flying along the trajectory, and configured to receive the flying target by allowing the target to collide with the receiver. The excitation device may be configured to vibrate the receiver.

BRIEF DESCRIPTION OF DRAWINGS

Some embodiments of the present disclosure will be described below as just examples with reference to the accompanying drawings.

EMBODIMENTS

Contents

Figure 1:
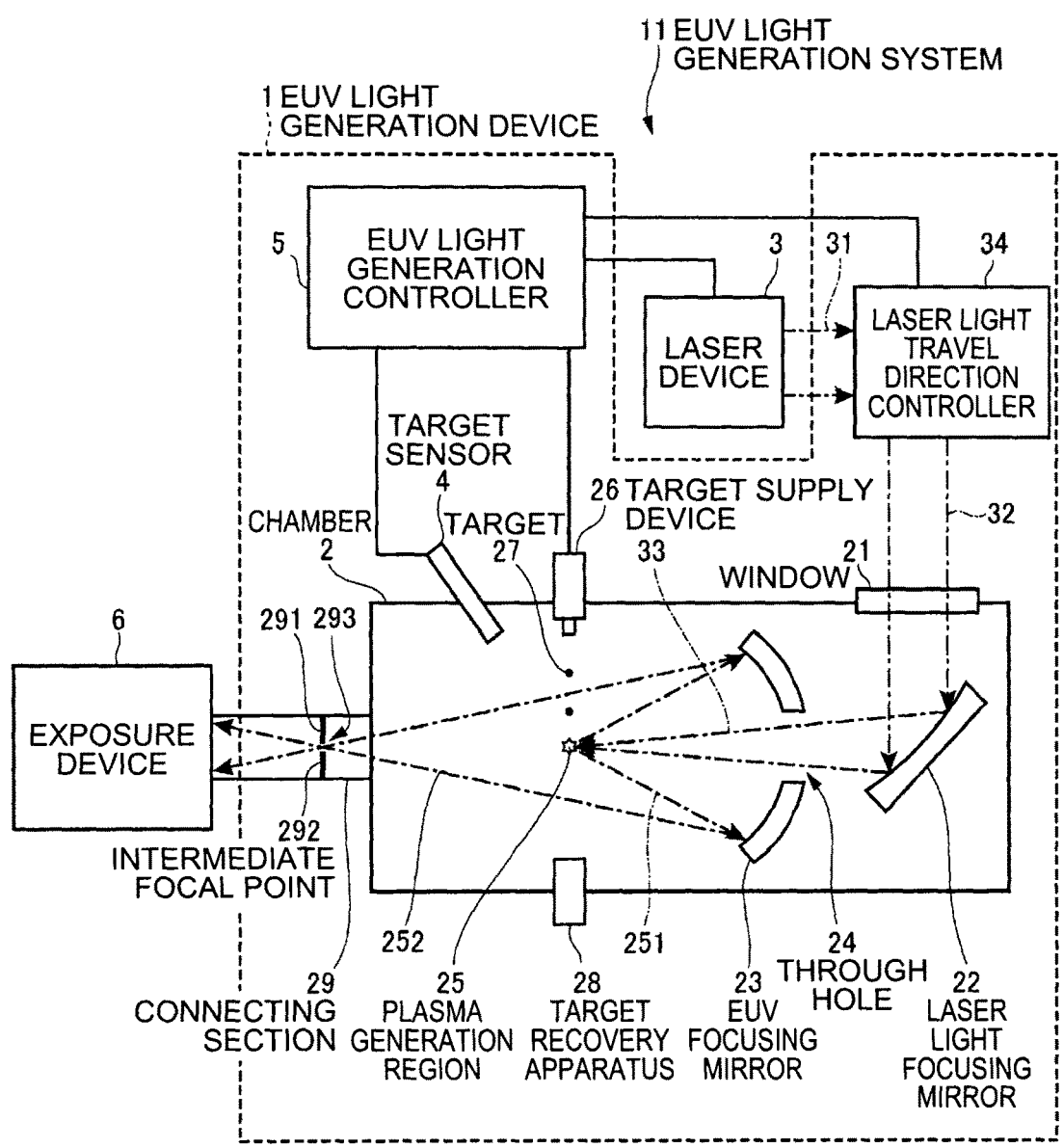
FIG. 1 schematically illustrates a configuration of an exemplary LPP type EUV light generation system.

1. Overview
2. Terms
3. Overall description of EUV light generation system
3.1 Configuration
3.2 Operation
4. Target recovery apparatus provided to EUV light generation device
4.1 Configuration
4.2 Operation
4.3 Effect
5. Problem
6. Target recovery apparatus provided to EUV light generation device of first embodiment
6.1 Configuration
6.2 Operation
6.3 Effect
6.4 Modification 1 of first embodiment
6.5 Modification 2 of first embodiment
7. Target recovery apparatus provided to EUV light generation device of second embodiment
7.1 Modification 1 of second embodiment
7.2 Modification 2 of second embodiment
8. Target recovery apparatus provided to EUV light generation device of third embodiment
8.1 Configuration
8.2 Operation
8.3 Effect
8.4 Modification 1 of third embodiment
9. Target recovery apparatus provided to EUV light generation device of fourth embodiment
9.1 Configuration
9.2 Operation
9.3 Effect
9.4 Modification 1 of fourth embodiment
9.5 Modification 2 of fourth embodiment
10. Target recovery apparatus provided to EUV light generation device of fifth embodiment
10.1 Modification 1 of fifth embodiment
10.2 Modification 2 of fifth embodiment
11. Target recovery apparatus provided to EUV light generation device of sixth embodiment
11.1 Modification 1 of sixth embodiment
11.2 Modification 2 of sixth embodiment
12. Target recovery apparatus provided to EUV light generation device of seventh embodiment
12.1 Configuration
12.2 Operation
12.3 Effect
12.4 Modification 1 of seventh embodiment
12.5 Modification 2 of seventh embodiment
13. Others Hereinafter, embodiments of the present disclosure will be described in detail with reference to the drawings. The embodiments described below illustrate some examples of the present disclosure, and do not limit the contents of the present disclosure. All of configurations and operations described in the embodiments are not always indispensable as configurations and operations of the present disclosure. It should be noted that the same constituent elements are denoted by the same reference signs, and overlapping description is omitted.

1. Overview

The present disclosure can at least disclose embodiments described below as mere examples.

An EUV light generation device 1 of the present disclosure includes a chamber 2 in which EUV light 252 is generated when a target 27 is irradiated with pulse laser light 33 in a plasma generation region 25 in the chamber 2, a target supply device 26 configured to output the target 27 toward the plasma generation region 25 in the chamber 2 to supply the target 27 to the plasma generation region 25, and a target recovery apparatus 28 configured to recover the target 27 output from the target supply device 26 and not irradiated with the pulse laser light 33. The target recovery apparatus 28 may include a receiver 280 disposed to be inclined with respect to a target trajectory 272 of the target 27 output from the target supply device 26 and configured to receive the target 27 not irradiated with the pulse laser light 33 by allowing the target to collide with it, and an excitation device 2851 configured to vibrate the receiver 280.

With this configuration, the EUV light generation device 1 is able to suppress accumulation of the target 27 on the receiver 280. Thereby, the EUV light generation device 1 is able to suppress lowering of reflectance of the EUV focusing mirror 23 due to splash of the target 27 adhering to the EUV focusing mirror 23. Thus, stable EUV light 252 can be generated.

2. Terms

"Target" is an object irradiated with laser light introduced into the chamber. A target irradiated with laser light is made into plasma and radiates EUV light.

"Droplet" is a mode of a target to be supplied to the chamber.

"Optical path axis" is an axis passing through a center of a beam cross section of laser light along a travel direction of the laser light.

"Optical path" is a path through which laser light passes. An optical path may include an optical path axis.

"Plasma generation region" is a predetermined region in the chamber. A plasma generation region is a region where a target output to the chamber is irradiated with laser light and the target is made into plasma.

"Target trajectory" is a trajectory of a target output to the chamber and travelling in the chamber. In the plasma generation region, a target trajectory may intersect an optical path of the laser light introduced in the chamber.

3. Overall Description of EUV Light Generation System

[3.1 Configuration]

FIG. 1 schematically illustrates a configuration of an exemplary LPP type EUV light generation system.

The EUV light generation device 1 may be used together with at least one laser device 3. In the present application, a system including the EUV light generation device 1 and the laser device 3 is referred to as an EUV light generation system 11. As illustrated in FIG. 1 and described below in detail, the EUV light generation device 1 may include the chamber 2 and a target supply device 26. The chamber 2 may be sealable. The target supply device 26 may be provided so as to penetrate a wall of the chamber 2, for example. A material of a target 27 supplied from the target supply device 26 may be, but not limited to, tin, terbium, gadolinium, lithium, xenon, or a combination of any two or more of them.

A wall of the chamber 2 may have at least one through hole. The through hole may be provided with a window 21. Pulse laser light 32 output from the laser device 3 may penetrate the window 21. In the chamber 2, an EUV focusing mirror 23 having a spheroidal reflecting surface may be disposed, for example. The EUV focusing mirror 23 may have a first focal point and a second focal point. On the surface of the EUV focusing mirror 23, a multilayer reflection film in which molybdenum and silicon are alternately layered, for example, may be formed. It is preferable that the EUV focusing mirror 23 is disposed such that the first focal point locates in the plasma generation region 25 and the second focal point locates at an intermediate focal point (IF) 292, for example. The EUV focusing mirror 23 may have a through hole 24 in a center portion thereof, and pulse laser light 33 may pass through the through hole 24.

The EUV light generation device 1 may include an EUV light generation controller 5, a target sensor 4, and the like. The target sensor 4 may have an image capturing function, and may be configured to detect presence, trajectory, position, velocity, and the like of the target 27.

The EUV light generation device 1 may also include a connecting section 29 configured to provide communication between an inside of the chamber 2 and an inside of an exposure device 6. In the connecting section 29, a wall 291 having an aperture 293 may be provided. The wall 291 may be disposed such that the aperture 293 locates at a second focal point position of the EUV focusing mirror 23.

Moreover, the EUV light generation device 1 may include a laser light travel direction controller 34, a laser light focusing mirror 22, a target recovery apparatus 28 for recovering the target 27, and the like. The laser light travel direction controller 34 may have an optical element configured to define a travel direction of the laser light, and an actuator configured to regulate a position, posture, and the like of the optical element.

[3.2 Operation]

Referring to FIG. 1, the pulse laser light 31 output from the laser device 3 may pass through the laser light travel direction controller 34, and penetrate the window 21 as pulse laser light 32 to enter the chamber 2. The pulse laser light 32 may travel inside the chamber 2 along at least one laser light path, and may be reflected at the laser light focusing mirror 22, and radiated as the pulse laser light 33 to at least one target 27.

The target supply device 26 may be configured to output the target 27 toward the plasma generation region 25 in the chamber 2. The target 27 may be irradiated with at least one pulse included in the pulse laser light 33. The target 27 irradiated with the pulse laser light 33 is made into plasma, and EUV light 251 may be radiated from the plasma along with radiation of light having a different wavelength. The EUV light 251 may be reflected selectively by the EUV focusing mirror 23. The EUV light 252 reflected by the EUV focusing mirror 23 may be focused at an intermediate focal point 292 and output to the exposure device 6. It should be noted that one target 27 may be irradiated with a plurality of pulses included in the pulse laser light 33.

The EUV light generation controller 5 may be configured to integrally control the EUV light generation system 11 as a whole. The EUV light generation controller 5 may be configured to process image data or the like of the target 27 captured by the target sensor 4. Further, the EUV light generation controller 5 may perform at least one of control of a timing when the target 27 is output and control of an output direction or the like of the target 27, for example. Furthermore, the EUV light generation controller 5 may perform at least one of control of an output timing of the laser device 3, control of the travel direction of the pulse laser light 32, and control of a light focusing position of the pulse laser light 33, for example. The various types of control described above are merely examples, and other control can be added when necessary.

4. Target Recovery Apparatus Provided to EUV Light Generation Device

The target recovery apparatus 28 provided to the EUV light generation device 1 will be described.

As illustrated in FIG. 1, the target recovery apparatus 28 may be an apparatus configured to recover the target 27 output from the target supply device 26 into the chamber 2.

Particularly, the target recovery apparatus 28 may be an apparatus configured to recover the target 27 not irradiated with the pulse laser light 33 among the targets 27 output from the target supply device 26 into the chamber 2.

As illustrated in FIG. 1, the target recovery apparatus 28 may be disposed on a lateral face side of the chamber 2. The target recovery apparatus 28 may be disposed on an extended line of the target trajectory that is a travel path of the target 27 output into the chamber 2.

It should be noted that the target 27 may be made of a metallic material. The target 27 made of a metallic material may include tin, terbium, gadolinium, or lithium or a combination of any two of them, as described above.

The target supply device 26 may store the target 27 that is made of a metallic material and is melted in advance. The target supply device 26 may output the melted target 27 as a droplet 271 toward the plasma generation region 25 in the chamber 2. Thereby, the target supply device 26 may supply the target 27 to the plasma generation region 25.

[4.1 Configuration]

A specific configuration of the target recovery apparatus 28 will be described with reference to FIGS. 2A and 2B.

Figure 2A:
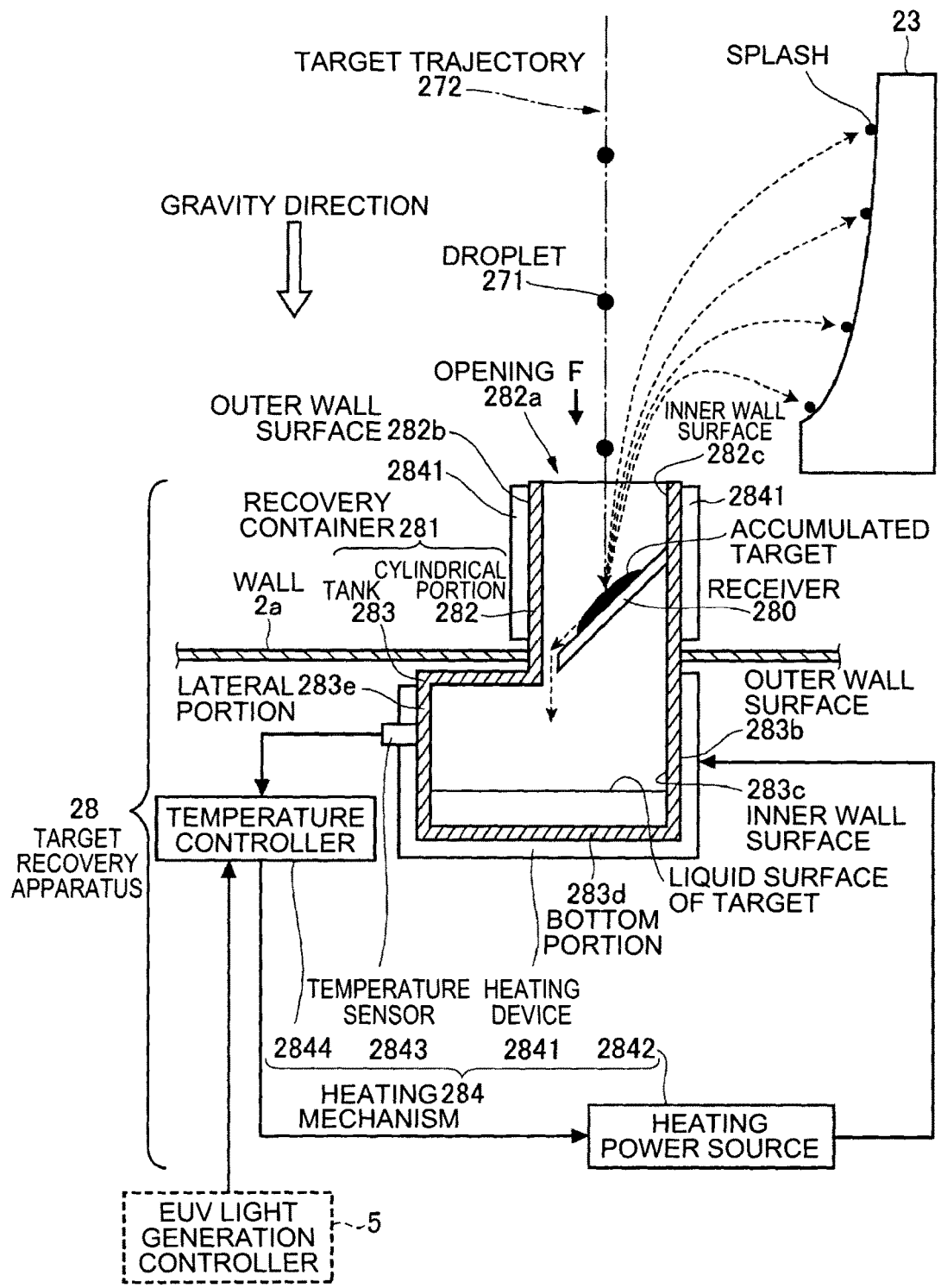
FIG. 2A is a drawing for explaining a specific configuration of a target recovery apparatus.
Figure 2B:
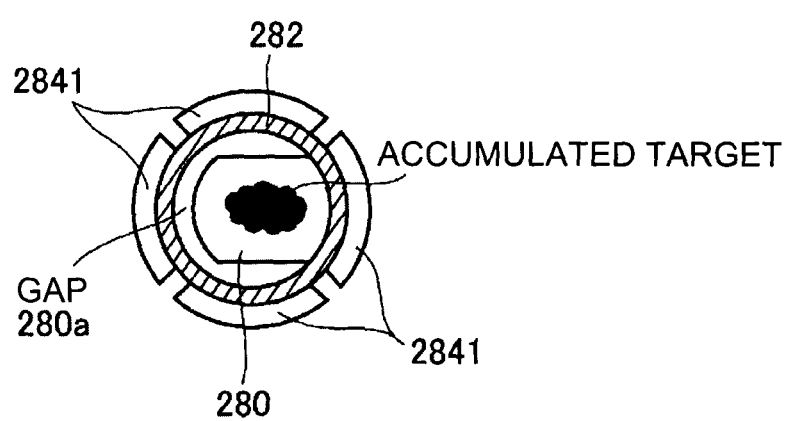
FIG. 2B is a drawing for explaining a receiver and a cylindrical portion, illustrated in FIG. 2A, seen from an F direction.

FIG. 2A is a drawing for explaining the specific configuration of the target recovery apparatus 28. FIG. 2B illustrates a receiver 280 and a cylindrical portion 282, illustrated in FIG. 2A, seen from an F direction.

The target recovery apparatus 28 may include the receiver 280, a recovery container 281, and a heating mechanism 284.

The recovery container 281 may be a container configured to recover the target 27 not irradiated with the pulse laser light 33.

The recovery container 281 may include the cylindrical portion 282 and a tank 283.

The cylindrical portion 282 may be formed to be in a hollow, substantially cylindrical shape with open bottom.

The cylindrical portion 282 may be made of a material having high heat conductivity and having heat resistance to a temperature equal to or higher than a melting point of the target 27.

The cylindrical portion 282 may be disposed so as to penetrate a wall 2a of the chamber 2. An opening 282a on one end side of the cylindrical portion 282 may be located inside the chamber 2. The opening 282a may be an opening for the target 27 not irradiated with the pulse laser light 33 to enter into the recovery container 281. An opening on another end side of the cylindrical portion 282 may be located outside the chamber 2.

The cylindrical portion 282 may be connected with a wall 2a with use of an airtight flange or the like not illustrated. Accordingly, airtightness can be secured inside the chamber 2.

The cylindrical portion 282 may be disposed such that a central axis thereof substantially coincides with the target trajectory 272.

The tank 283 may be a container in which an inside thereof communicates with the cylindrical portion 282.

The tank 283 may be connected with an end portion of the cylindrical portion 282 provided on an outer side of the chamber 2.

The tank 283 may be made of a material having high heat conductivity and having heat resistance to a temperature equal to or higher than the melting point of the target 27. The tank 283 may be made of a material that is the same as that of the cylindrical portion 282.

The tank 283 may be integrally formed with the cylindrical portion 282.

The heating mechanism 284 may be a mechanism of heating the recovery container 281 and controlling a temperature in the recovery container 281.

The heating mechanism 284 may include a heating device 2841, a heating power source 2842, a temperature sensor 2843, and a temperature controller 2844.

The heating device 2841 may be a heater configured to heat the recovery container 281.

The heating device 2841 may be disposed so as to cover the cylindrical portion 282 and the tank 283.

The heating device 2841 may be disposed on at least one of an outer wall surface 282b of the cylindrical portion 282 and an outer wall surface 283b of the tank 283.

The heating power source 2842 may be a power source configured to supply electrical power to the heating device 2841.

The heating power source 2842 may be electrically connected with the heating device 2841.

The temperature sensor 2843 may be a sensor configured to detect the temperature of the recovery container 281.

The temperature sensor 2843 may be disposed on the outer wall surface 283b of the tank 283.

The temperature controller 2844 may be a controller configured to control the temperature in the recovery container 281.

The temperature controller 2844 may be electrically connected with the heating power source 2842 and the temperature sensor 2843.

The temperature controller 2844 may be connected with the EUV light generation controller 5.

The receiver 280 may be a member configured to receive the target 27 not irradiated with the pulse laser light 33 by allowing the target 27 to collide with it.

The receiver 280 may be an elastic body configured by using a plate-like member.

The receiver 280 may be made of a material having high heat conductivity and having heat resistance to a temperature equal to or higher than the melting point of the target 27.

The receiver 280 may be made of a material less likely to be wet by the melted target 27. The receiver 280 may be made of a material on which a contact angle with the melted target 27 is 90° or larger.

The receiver 280 may be provided inside the recovery container 281.

The receiver 280 may be supported by an inner wall surface 282c of the cylindrical portion 282 that is a portion of an inner wall surface of the recovery container 281.

The receiver 280 may not completely close the inside of the cylindrical portion 282. One end of the receiver 280 may be supported by a portion of the inner wall surface 282c of the cylindrical portion 282. Between the other end of the receiver 280 and another portion of the inner wall surface 282c, a gap 280a may be formed.

The receiver 280 may be disposed to be inclined with respect to each of the target trajectory 272 and the gravity direction. The receiver 280 may be disposed such that the angle of inclination with respect to each of the target trajectory 272 and the gravity direction is an angle other than 90°.

[4.2 Operation]

Operation of the target recovery apparatus 28 illustrated in FIG. 2A will be described.

A signal that is output from the EUV light generation controller 5 and designates a target temperature of the recovery container 281 may be input to the temperature controller 2844.

A temperature detection signal output from the temperature sensor 2843 may be input to the temperature controller 2844.

The temperature controller 2844 may control electrical power supplied from the heating power source 2842 to the heating device 2841 in such a manner that a detection value indicated by the temperature detection signal approaches the target temperature.

The temperature of the recovery container 281 including the cylindrical portion 282 and the tank 283 can be controlled to be the target temperature. At that time, to the receiver 280 supported by the inner wall surface 282c of the cylindrical portion 282, the heat generated by the heating device 2841 can be transmitted via the cylindrical portion 282. Thereby, the temperature of the receiver 280 can be controlled to be a predetermined temperature that is lower than the target temperature.

The predetermined temperature of the receiver 280 may be a temperature equal to or higher than the melting point of the target 27. In the case where the target 27 is tin, the predetermined temperature of the receiver 280 may be about 280° C., for example.

The target temperature of the recovery container 281 may be a temperature that the receiver 280 reaches the predetermined temperature. The target temperature of the recovery container 281 may be higher than the predetermined temperature of the receiver 280. In the case where the target 27 is tin, the target temperature of the recovery container 281 may be in a range between 400° C. and 500° C., for example.

When the EUV light generation device 1 generates the EUV light 252, the target supply device 26 may output the target 27 in a melted state as the droplet 271 toward the plasma generation region 25 in the chamber 2 with control by the EUV light generation controller 5.

Further, the laser device 3 may output the pulse laser light 31 such that the target 27 is irradiated with the pulse laser light 33 in the plasma generation region 25 with control by the EUV light generation controller 5.

The target 27 irradiated with the pulse laser light 33 can be made into plasma, and radiate light including the EUV light 251.

Meanwhile, the target 27 not irradiated with the pulse laser light 33 can pass through the plasma generation region 25, and fly as it is along the target trajectory 272. Then, the target 27 can enter the recovery container 281 from the opening 282a of the cylindrical portion 282. The velocity of the target 27 not irradiated with the pulse laser light 33 may be in a range from 60 m/s to 100 m/s. The target 27 entering the recovery container 281 can collide with the receiver 280.

The receiver 280 can be deformed to be bent when the target 27 collides with it. Thereby, the receiver 280 can reduce the kinetic energy of the target 27. Deformation of the receiver 280 can be restored.

The target 27 in which the kinetic energy is reduced can drop into the tank 283 heated to a temperature equal to or higher than the melting point of the target 27, and can be stored in the tank 283.

Thereafter, the following targets 27 can drop into the tank 283 sequentially, and a liquid surface of the targets 27 can be formed in the tank 283.

[4.3 Effect]

The receiver 280 is deformed to be bent when the target 27 collides with it whereby the receiver 280 can reduce a kinetic energy of the target 27, as described above.

Accordingly, the target recovery apparatus 28 can suppress generation of splash that is generated by collision of the target 27 with the liquid surface of the target 27 formed in the tank 283 or a bottom portion 283d of the tank 283.

Thereby, the target recovery apparatus 28 can suppress the splash flying outside the recovery container 281 and adhering to the EUV focusing mirror 23.

The recovery container 281 is heated to be a temperature equal to or higher than the melting point of the target 27.

As such, even if the target 27 drops into the tank 283 of the recovery container 281, the target recovery apparatus 28 can suppress solidification of the target 27 and deposition of the target 27 in a dendritic shape and growing on the bottom portion 283d of the tank 283.

When the target 27 is deposited in a dendritic shape and grows, the dendritic deposits may reach the plasma generation region 25, which may impede generation of the EUV light 252. Accordingly, at the time when the dendritic deposits of the target 27 protrude from the opening 282a of the cylindrical portion 282, it may be necessary to change the target recovery apparatus 28. If it is possible to suppress deposition of the target 27 in a dendritic shape, an operating time of the target recovery apparatus 28 can be improved.

The receiver 280 is also heated to be a temperature equal to or higher than the melting point of the target 27, as described above.

Accordingly, even when the target 27 collides with the receiver 280, the target recovery apparatus 28 can cause the target 27 to drop into the tank 283 as liquid through the receiver 280. Therefore, it is possible to suppress solidification of the target 27 on the receiver 280.

5. Problems

In the target recovery apparatus 28 illustrated in FIG. 2A, it is possible to cause the target 27 that collided with the receiver 280 to drop into the tank 283 as liquid. However, when the target 27 is recovered to a certain extent, a portion of the target 27 may slightly adhere to the receiver 280. In that case, the subsequent target 27 may collide with the target 27 adhering to the receiver 280 and a portion thereof may further stay on the receiver 280. In this way, in the target recovery apparatus 28 illustrated in FIG. 2A, the target 27 may gradually be accumulated on the receiver 280.

When the target 27 is accumulated on the receiver 280, the subsequent target 27 may collide with the accumulated target 27 and cause splash.

Alternatively, there is also a case where the receiver 280 deformed by the weight of the accumulated target 27 cannot be restored and the kinetic energy of the subsequent target 27 cannot be reduced. Accordingly, the target 27 may collide with the liquid surface of the target 27 formed in the tank 283 or the bottom portion 283d of the tank 283 to cause splash.

Therefore, in the EUV light generation device 1 provided with the target recovery apparatus 28 illustrated in FIG. 2A, such splash may fly outside the recovery container 281 and adhere to the EUV focusing mirror 23, whereby a reflectance of the EUV focusing mirror 23 may drop partially.

Consequently, in the EUV light generation device 1 provided with the target recovery apparatus 28 illustrated in FIG. 2A, output of the EUV light 252 may drop, and a beam profile of the EUV light 252 may deteriorate.

Thus, it is desired to have a technology capable of generating stable EUV light 252, by suppressing accumulation of the target 27 on the receiver 280 to thereby suppress lowering of the reflectance of the EUV focusing mirror 23.

6. Target Recovery Apparatus Provided to EUV Light Generation Device of First Embodiment The target recovery apparatus 28 provided to the EUV light generation device 1 of the first embodiment will be described with reference to FIGS. 3A and 3B.

The target recovery apparatus 28 provided to the EUV light generation device 1 of the first embodiment may have a configuration in which an excitation mechanism 285 is added to the target recovery apparatus 28 illustrated in FIG. 2A.

Regarding the configuration of the EUV light generation device 1 of the first embodiment, description of the configuration that is the same as the configuration of the EUV light generation device 1 illustrated in FIGS. 1 and 2A is omitted.

[6.1 Configuration]

Figure 3A:
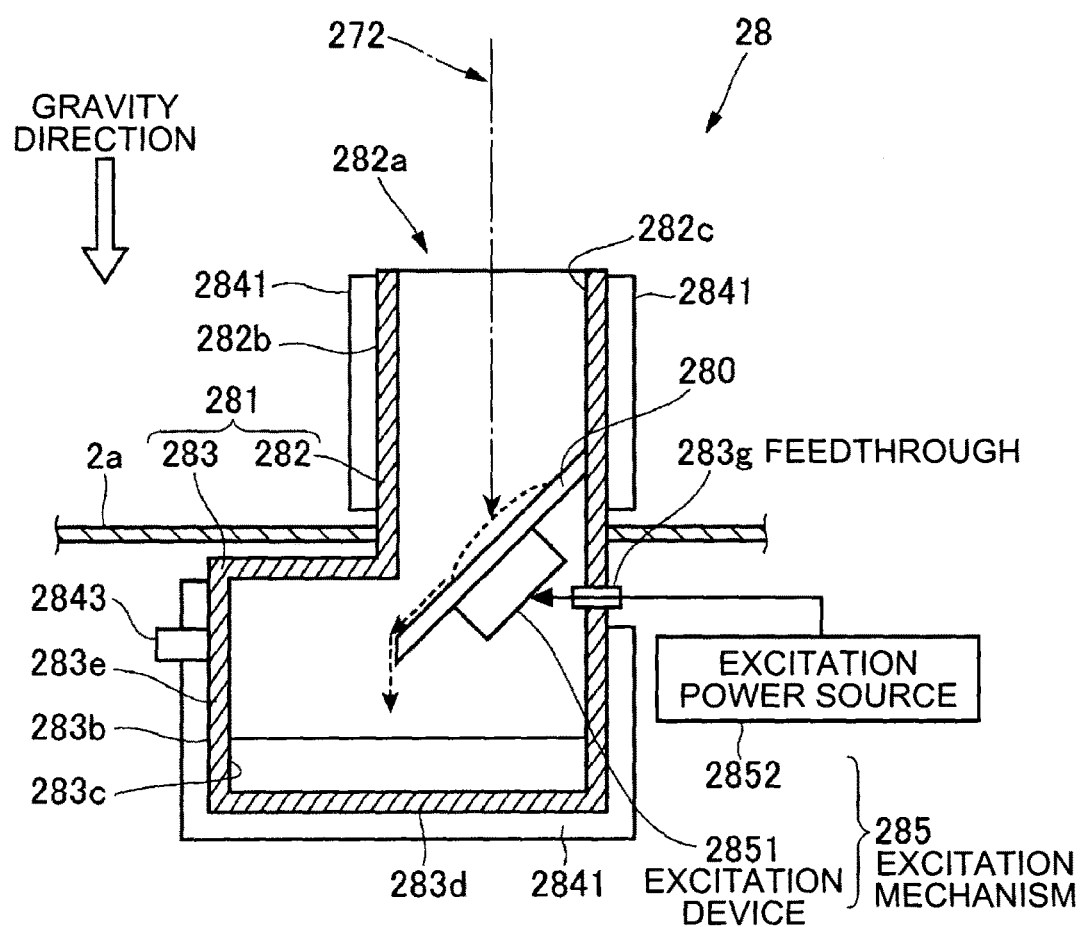
FIG. 3A is a drawing for explaining a configuration of a target recovery apparatus provided to an EUV light generation device of a first embodiment.
Figure 3B:
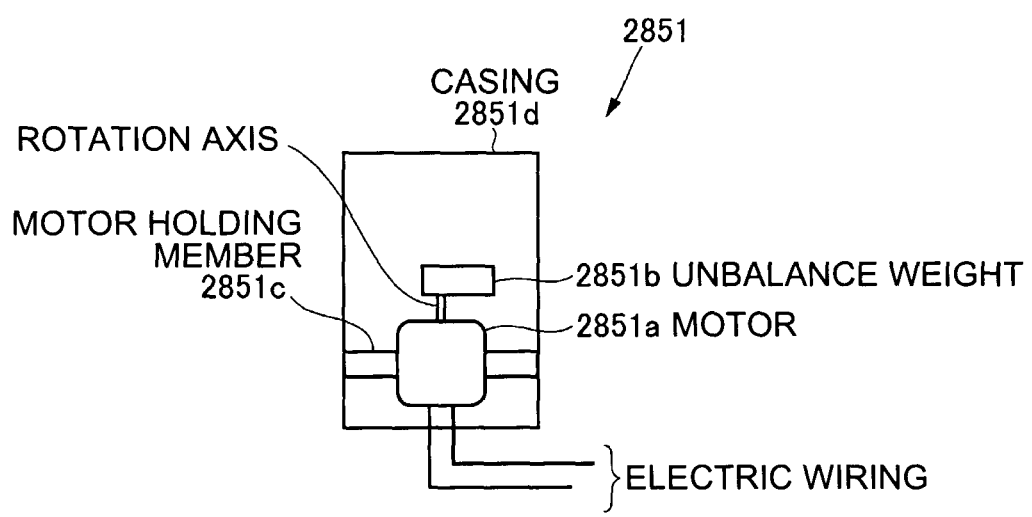
FIG. 3B is a drawing for explaining a configuration of an excitation device illustrated in FIG. 3A.

FIG. 3A is a drawing for explaining a configuration of the target recovery apparatus 28 provided to the EUV light generation device 1 of the first embodiment. FIG. 3B is a drawing for explaining a configuration of the excitation device 2851 illustrated in FIG. 3A.

The target recovery apparatus 28 of FIG. 3A may include the receiver 280, the recovery container 281, and the heating mechanism 284. These constituent elements may be the same as those of the target recovery apparatus 28 illustrated in FIG. 2A, respectively. Although the heating power source 2842 and the temperature controller 2844 are omitted in the heating mechanism 284 of FIG. 3A, the target recovery apparatus 28 in this configuration may include the heating power source 2842 and the temperature controller 2844. This also applies to the subsequent drawings.

The target recovery apparatus 28 of FIG. 3A may further include the excitation mechanism 285.

The excitation mechanism 285 may be a mechanism of vibrating the receiver 280.

The excitation mechanism 285 may include the excitation device 2851 and an excitation power source 2852.

The excitation device 2851 may be a vibrator configured to vibrate the receiver 280.

The excitation device 2851 may be directly connected with the receiver 280 that is a plate-like member.

The excitation device 2851 may be disposed on a surface of the side not colliding with the target 27 of the receiver 280.

The excitation device 2851 may vibrate the receiver 280 such that it has a vibration component in a direction substantially orthogonal to the target trajectory 272.

As illustrated in FIG. 3B, the excitation device 2851 may include a motor 2851a, an unbalance weight 2851b, a motor holding member 2851c, and a casing 2851d.

The excitation device 2851 may be configured such that the motor 2851a, connected with the unbalance weight 2851b, is connected with the casing 2851d via the motor holding member 2851c.

Electric wiring for the motor 2851a may penetrate the casing 2851d and connect to the excitation power source 2852.

As the motor 2851a, a motor of any type including an AC (alternating current) motor such as an induction motor, a DC (direct current) motor, or an ultrasonic motor may be used.

The unbalance weight 2851b may be connected with the rotation axis of the motor 2851a. The unbalance weight 2851b may be a weight body having a center of gravity eccentric to the rotation axis of the motor 2851a.

The excitation power source 2852 may be a power source configured to supply electrical power to the motor 2851a included in the excitation device 2851.

The excitation power source 2852 may be configured of a power source according to the type of the motor 2851a.

The excitation power source 2852 may be electrically connected with the excitation device 2851 via a feedthrough 283g penetrating a lateral portion 283e of the tank 283.

The excitation power source 2852 may be electrically connected with the EUV light generation controller 5, although not illustrated.

It should be noted that the excitation device 2851 may be configured using a piezoelectric element, an electrostrictive element, or a magnetostrictive element. In any case, it is only necessary that the excitation device 2851 is a device directly connectable with the receiver 280 and capable of vibrating the receiver 280.

The other part of the configuration of the target recovery apparatus 28 according to the first embodiment may be the same as that of the target recovery apparatus 28 illustrated in FIG. 2A.

[6.2 Operation]

Operation of the target recovery apparatus 28 according to the first embodiment will be described.

Regarding operation of the target recovery apparatus 28 according to the first embodiment, description of the operation that is the same as the operation of the target recovery apparatus 28 illustrated in FIG. 2A is omitted.

The EUV light generation controller 5 may control electrical power supplied from the excitation power source 2852 to the excitation device 2851 such that the motor 2851a of the excitation device 2851 rotates at a predetermined rotation speed.

The EUV light generation controller 5 may control the excitation power source 2852 such that the excitation device 2851 vibrates only during the period when the target supply device 26 outputs the target 27. Alternatively, the EUV light generation controller 5 may control the excitation power source 2852 such that the excitation device 2851 vibrates during a period when the EUV light 252 is not generated.

The excitation power source 2852 may change electrical power supplied to the motor 2851a with control by the EUV light generation controller 5.

In the excitation device 2851, when the motor 2851a rotates, vibration may be caused by the inertial force accompanying the rotation of the unbalance weight 2851b. The vibration can be transmitted to the receiver 280 via the rotation axis of the motor 2851a, the motor 2851a, the motor holding member 2851c, and the casing 2851d. The receiver 280 can vibrate in synchronization with the vibration.

As described above, a portion of the target 27 that collided with the receiver 280 may slightly adhere to the receiver 280.

In that case, as the receiver 280 is heated to the temperature equal to or higher than the melting point of the target 27, the target 27 adhering to the receiver 280 may be in a melted state.

Accordingly, with the vibration of the receiver 280 by the excitation device 2851, the target 27 adhering to the receiver 280 can drop into the tank 283 through the receiver 280 and can be stored in the tank 283.

It should be noted that when the excitation device 2851 is configured of a piezoelectric element or the like as described above, the EUV light generation controller 5 may control electrical power supplied from the excitation power source 2852 to the excitation device 2851 such that the excitation device 2851 vibrates at a predetermined vibration frequency.

Regarding the predetermined rotation speed of the motor 2851a and the predetermined vibration frequency of the excitation device 2851, values with which the target 27 adhering to the receiver 280 drops may be set in advance through experiments or the like.

The other part of the operation of the target recovery apparatus 28 according to the first embodiment may be the same as that of the target recovery apparatus 28 illustrated in FIG. 2A.

[6.3 Effect]

In the target recovery apparatus 28 according to the first embodiment, even if the target 27 adheres to the receiver 280, the target 27 is caused to drop into the tank 283 by the vibration of the receiver 280. Thereby, it is possible to suppress accumulation of the target 27 on the receiver 280.

Thereby, the EUV light generation device 1 provided with the target recovery apparatus 28 according to the first embodiment is able to suppress generation of splash of the target 27 and adhesion to the EUV focusing mirror 23.

Consequently, the EUV light generation device 1 of the first embodiment can suppress lowering of the reflectance of the EUV focusing mirror 23, and generate stable EUV light 252.

[6.4 Modification 1 of First Embodiment]

A target recovery apparatus 28 provided to the EUV light generation device 1 according to a modification 1 of the first embodiment will be described with reference to FIGS. 4A to 4C.

In the target recovery apparatus 28 according to the modification 1 of the first embodiment, arrangement of the excitation device 2851 may be mainly different from that of the target recovery apparatus 28 of the first embodiment.

Regarding the configuration of the EUV light generation device 1 according to the modification 1 of the first embodiment, description of the configuration that is the same as the configuration of the EUV light generation device 1 of the first embodiment is omitted.

Figure 4A:
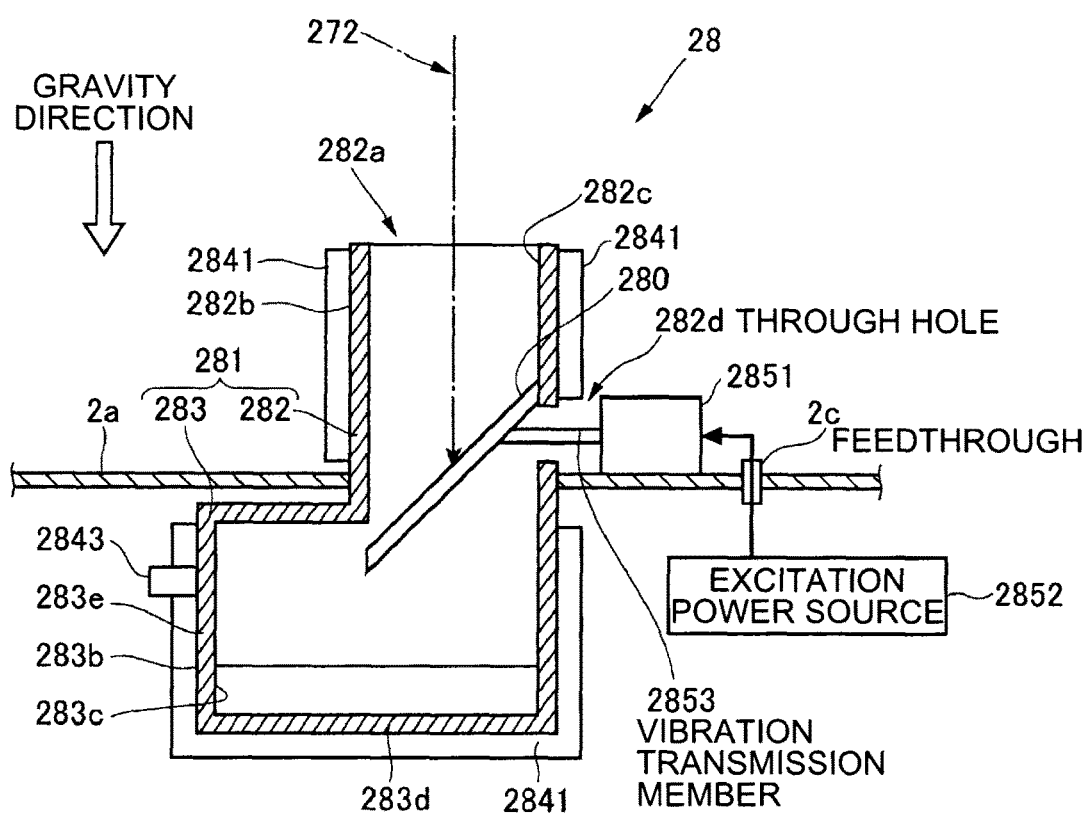
FIG. 4A is a drawing for explaining a target recovery apparatus provided to an EUV light generation device of a modification 1 of the first embodiment.

FIG. 4A is a drawing for explaining the target recovery apparatus 28 provided to the EUV light generation device 1 according to the modification 1 of the first embodiment. FIG. 4B is a drawing for explaining a connection relationship between a vibration transmission member 2853 and an excitation device 2851 illustrated in FIG. 4A. FIG. 4C is a drawing for explaining another example of a connection relationship between the vibration transmission member 2853 and the excitation device 2851 illustrated in FIG. 4A.

The excitation device 2851 of FIG. 4A may not be connected directly with the receiver 280.

Specifically, the excitation device 2851 may be disposed outside the recovery container 281 so as to be separated from the receiver 280. The excitation device 2851 may be disposed on the inner wall surface of the wall 2a of the chamber 2.

The excitation device 2851 and the receiver 280 may be connected by a vibration transmission member 2853 passing through a through hole 282d provided in the cylindrical portion 282 of the recovery container 281.

The vibration transmission member 2853 may be made of a material having high rigidity.

Figure 4B:
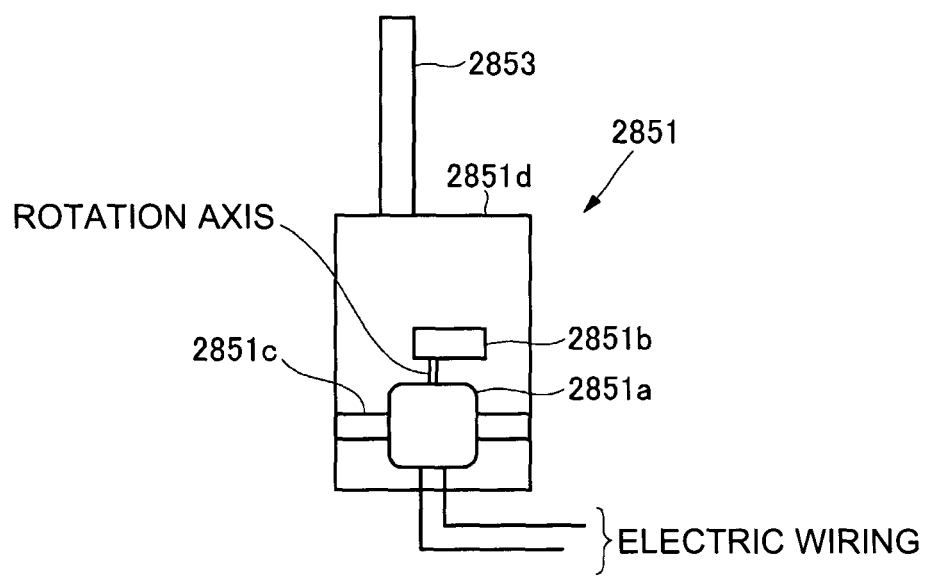
FIG. 4B is a drawing for explaining a connection relationship between a vibration transmission member and an excitation device illustrated in FIG. 4A.

The vibration transmission member 2853 may be provided to the casing 2851d of the excitation device 2851 as illustrated in FIG. 4B.

Figure 4C:
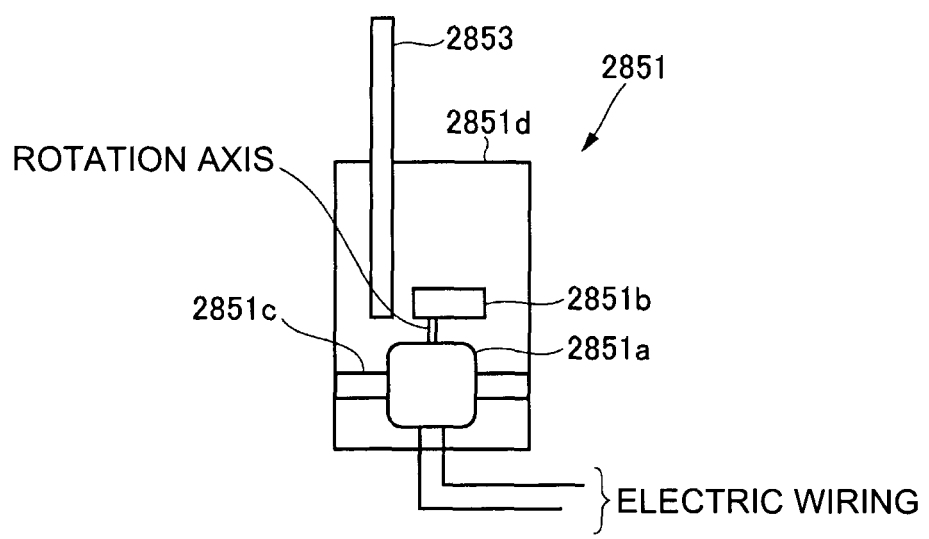
FIG. 4C is a drawing for explaining another example relating to a connection relationship between the vibration transmission member and the excitation device illustrated in FIG. 4A.

Alternatively, the vibration transmission member 2853 may be provided to penetrate the casing 2851d and extend to a position where it collides with the rotating unbalance weight 2851b, as illustrated in FIG. 4C. The vibration transmission member 2853 can vibrate when it collides with the rotating unbalance weight 2851b.

The excitation power source 2852 may be electrically connected with the excitation device 2851 disposed in the chamber 2 via a feedthrough 2c penetrating the wall 2a of the chamber 2.

The other part of the configuration of the target recovery apparatus 28 according to the modification 1 of the first embodiment may be the same as that of the target recovery apparatus 28 of the first embodiment.

With this configuration, the excitation device 2851 can transmit vibration to the receiver 280 via the vibration transmission member 2853 even though it is separated from the receiver 280.

Accordingly, the excitation device 2851 can be disposed away from the receiver 280 and the recovery container 281 heated to the temperature equal to or higher than the melting point of the target 27.

Thereby, the excitation device 2851 can suppress breakdown of the motor 2851a being exposed under a high-temperature environment.

Consequently, as the target recovery apparatus 28 according to the modification 1 of the first embodiment can improve the durability of the excitation device 2851, accumulation of the target 27 on the receiver 280 can be suppressed stably.

It should be noted that as illustrated in FIG. 4C, in the case where the unbalance weight 2851b and the vibration transmission member 2853 collide with each other, relatively large vibration may occur in the vibration transmission member 2853.

Therefore, the target recovery apparatus 28 including the vibration transmission member 2853 can further suppress accumulation of the target 27 on the receiver 280.

[6.5 Modification 2 of First Embodiment]

A target recovery apparatus 28 provided to the EUV light generation device 1 of a modification 2 of the first embodiment will be described with reference to FIG. 5.

In the target recovery apparatus 28 according to the modification 2 of the first embodiment, configurations of the receiver 280 and the recovery container 281 may be mainly different from those of the target recovery apparatus 28 according to the modification 1 of the first embodiment.

Regarding the configuration of the EUV light generation device 1 according to the modification 2 of the first embodiment, description of the configuration that is the same as the configuration of the EUV light generation device 1 of the modification 1 of the first embodiment is omitted.

Figure 5:
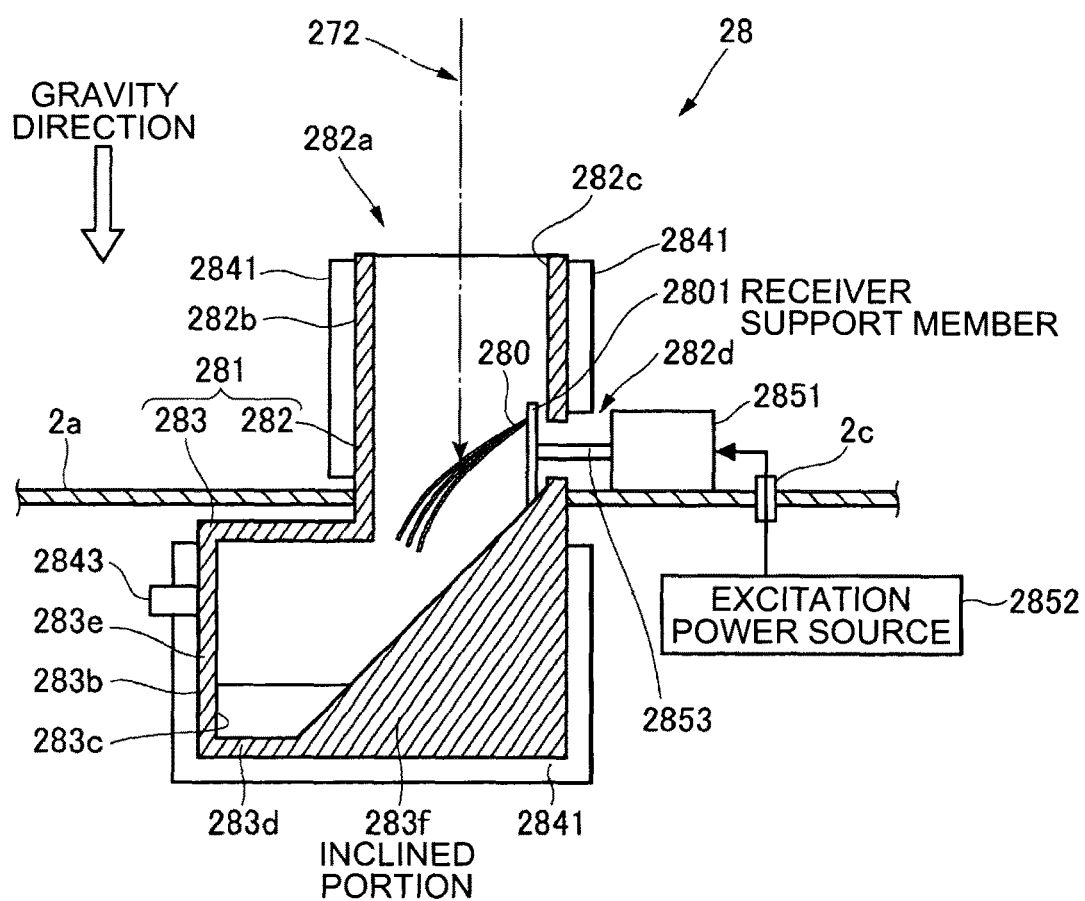
FIG. 5 is a drawing for explaining a target recovery apparatus provided to an EUV light generation device of a modification 2 of the first embodiment.

FIG. 5 is a drawing for explaining the target recovery apparatus 28 provided to the EUV light generation device 1 of the modification 2 of the first embodiment.

The receiver 280 of FIG. 5 may include a fiber member.

The receiver 280 configured of a fiber member may be made of a material having high heat conductivity and having heat resistance to the temperature equal to or higher than the melting point of the target 27, which is the same as the receiver 280 configured of a plate-like member described above. Moreover, the receiver 280 configured of a fiber member may be made of a material less likely to be wet and having a contact angle of 90° or larger with respect to the melted target 27, which is the same as the receiver 280 made of a plate-like member described above.

A fiber member constituting the receiver 280 may be configured of a plurality of fiber bundles. A fiber bundle may be a bundle of one or a plurality of fibers. The fiber bundle may be configured of carbon fibers or tungsten fine wires, for example.

The receiver 280 may be supported on the inner wall surface of the recovery container 281 via a support member 2801.

The support member 2801 may be connected with the vibration transmission member 2853 that is connected with the excitation device 2851.

The support member 2801 may be made of a material having lower rigidity than that of the vibration transmission member 2853. The support member 2801 may be formed to have a structure of lower rigidity than that of the vibration transmission member 2853.

As illustrated in FIG. 5, an inclined portion 283f may be formed on the inner wall surface of the recovery container 281 to which the support member 2801 is connected. The inclined portion 283f may be inclined at an angle of inclination that is substantially equal to the angle of inclination of the receiver 280.

The inclined portion 283f may be formed inside the tank 283. The inclined portion 283f may be formed by arranging a bulk-like member made of a material that is the same as that of a bottom portion 283d and a lateral portion 283e, on an inner wall surface 283c of the bottom portion 283d and the lateral portion 283e of the tank 283. The inclined portion 283f may be formed integrally with the bottom portion 283d and the lateral portion 283e of the tank 283.

The inclined portion 283f may be formed to be inclined with respect to each of the target trajectory 272 and the gravity direction, similar to the case of the receiver 280.

An inclined surface of the inclined portion 283f may be formed such that a tip end of the inclined surface extends toward the inner wall surface 283c of the bottom portion 283d of the tank 283, with a portion of the inner wall surface 283c of the lateral portion 283e of the tank 283 or a portion of the inner wall surface 282c of the cylindrical portion 282 serving as a base end.

The inclined surface of the inclined portion 283f may be formed to extend to the inner wall surface 283c of the bottom portion 283d over a tip end of the receiver 280 of a side not supported by the support member 2801.

The other part of the configuration of the target recovery apparatus 28 according to the modification 2 of the first embodiment may be the same as that of the target recovery apparatus 28 according to the modification 1 of the first embodiment.

With this configuration, the support member 2801 can amplify the amplitude of the vibration transmitted via the vibration transmission member 2853 having higher rigidity than that of the support member 2801.

Thereby, the receiver 280 can vibrate with larger amplitude compared with the case of being supported by a support member having rigidity similar to that of the vibration transmission member 2853.

Consequently, the target recovery apparatus 28 according to the modification 2 of the first embodiment can further suppress accumulation of the target 27 on the receiver 280.

Further, when the target 27 collides with the receiver 280, the receiver 280 is deformed such that some fiber bundles constituting the receiver 280 are bent, whereby the kinetic energy of the collided target 27 can be reduced. The target 27 may penetrate the receiver 280 and drops onto the inclined portion 283f of the tank 283 of the recovery container 281. This means that the target 27 penetrating the receiver 280 may not directly drop onto the liquid surface of the target 27 formed in the tank 283 or the bottom portion 283d of the tank 283, but can drop through the inclined portion 283f.

Consequently, the target recovery apparatus 28 according to the modification 2 of the first embodiment can further suppress generation of splash of the target 27.

7. Target Recovery Apparatus Provided to EUV Light Generation Device of Second Embodiment A target recovery apparatus 28 provided to an EUV light generation device 1 of a second embodiment will be described with reference to FIG. 6.

The target recovery apparatus 28 of the second embodiment may have a configuration in which a heat transfer suppression member 286 is added to the target recovery apparatus 28 of the first embodiment.

Regarding the configuration of the EUV light generation device 1 of the second embodiment, description of the configuration that is the same as the configuration of the EUV light generation device 1 of the first embodiment is omitted.

Figure 6:
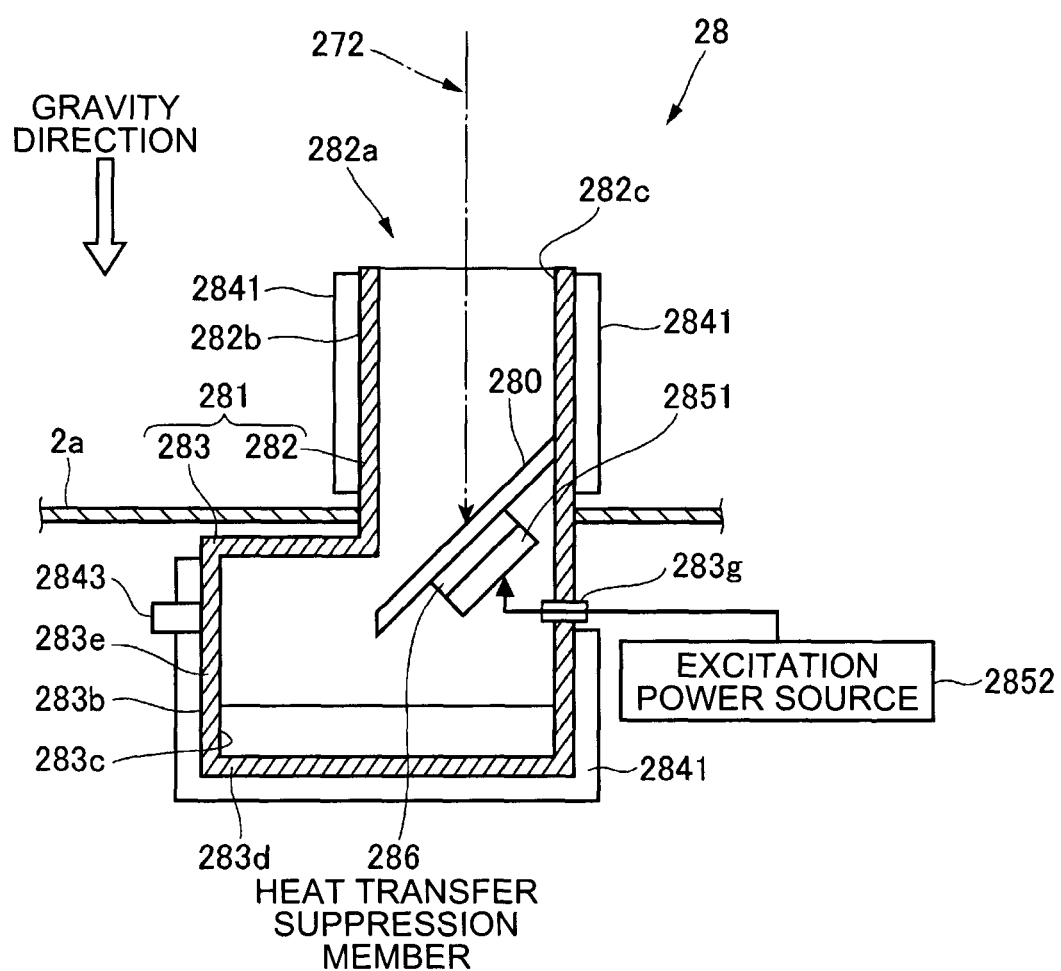
FIG. 6 is a drawing for explaining a target recovery apparatus provided to an EUV light generation device of a second embodiment.

FIG. 6 is a drawing for explaining the target recovery apparatus 28 provided to the EUV light generation device 1 of the second embodiment.

The excitation device 2851 of FIG. 6 may not be directly connected with the receiver 280 that is a plate-like member, but may be connected with the receiver 280 via the heat transfer suppression member 286.

The heat transfer suppression member 286 may be made of a material having low heat conductivity. The heat transfer suppression member 286 may be formed to be in a structure having low heat conductivity.

The heat transfer suppression member 286 may be made of a material having high rigidity, or may be formed to be in a structure having high rigidity, similar to the case of the vibration transmission member 2853 according to the modification 2 of the first embodiment. The heat transfer suppression member 286 may be formed of a box structure made of stainless or ceramics, for example.

The other part of the configuration of the target recovery apparatus 28 of the second embodiment may be the same as that of the target recovery apparatus 28 of the first embodiment.

With this configuration, the heat transfer suppression member 286 can transmit the vibration from the excitation device 2851 to the receiver 280.

Further, the heat transfer suppression member 286 can suppress transfer of the heat from the receiver 280 heated to have a high temperature equal to or higher than the melting point of the target 27, to the excitation device 2851.

Thereby, the heat transfer suppression member 286 can protect the excitation device 2851 from the heat and suppress breakdown of the motor 2851a, without attenuating the vibration transmitted from the excitation device 2851 to the receiver 280 as much as possible.

Consequently, the target recovery apparatus 28 of the second embodiment can improve durability of the excitation device 2851, whereby the accumulation of the target 27 on the receiver 280 can be suppressed stably.

[7.1 Modification 1 of Second Embodiment]

A target recovery apparatus 28 provided to an EUV light generation device 1 according to a modification 1 of the second embodiment will be described with reference to FIG. 7.

The target recovery apparatus 28 according to the modification 1 of the second embodiment may have a configuration in which the heat transfer suppression member 286 is added to the target recovery apparatus 28 of the modification 1 of the first embodiment.

Regarding the configuration of the EUV light generation device 1 according to the modification 1 of the second embodiment, description of the configuration that is the same as the configuration of the EUV light generation device 1 of the modification 1 of the first embodiment is omitted.

Figure 7:
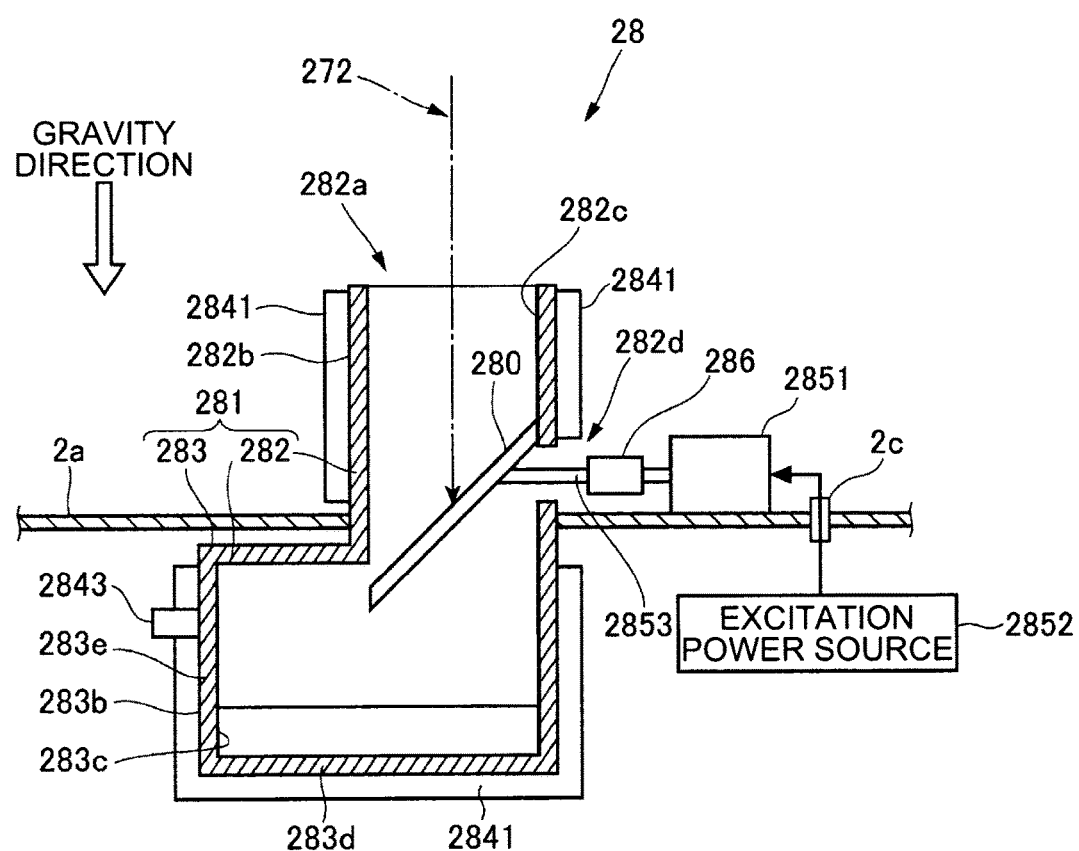
FIG. 7 is a drawing for explaining a target recovery apparatus provided to an EUV light generation device of a modification 1 of the second embodiment.

FIG. 7 is a drawing for explaining the target recovery apparatus 28 provided to the EUV light generation device 1 of the modification 1 of the second embodiment.

The heat transfer suppression member 286 of FIG. 7 may be disposed in the middle of the vibration transmission member 2853 connecting the excitation device 2851 and the receiver 280.

Alternatively, the heat transfer suppression member 286 may be disposed at an end portion of the vibration transmission member 2853.

The other part of the configuration of the heat transfer suppression member 286 may be the same as that of the heat transfer suppression member 286 of the target recovery apparatus 28 according to the second embodiment illustrated in FIG. 6.

The other part of the configuration of the target recovery apparatus 28 according to the modification 1 of the second embodiment may be the same at that of the target recovery apparatus 28 according to the modification 1 of the first embodiment.

With this configuration, the heat transfer suppression member 286 can protect the excitation device 2851 from the heat and further suppress breakdown of the motor 2851a, without attenuating the vibration transmitted from the excitation device 2851 to the receiver 280 as much as possible.

Consequently, the target recovery apparatus 28 according to the modification 1 of the second embodiment can further improve the durability of the excitation device 2851, whereby accumulation of the target 27 on the receiver 280 can be suppressed further stably.

[7.2 Modification 2 of Second Embodiment]

A target recovery apparatus 28 provided with an EUV light generation device 1 according to a modification 2 of a second embodiment will be described with reference to FIG. 8.

The target recovery apparatus 28 according to the modification 2 of the second embodiment may be configured in which the heat transfer suppression member 286 is added to the target recovery apparatus 28 according to the modification 2 of the first embodiment.

Further, in the target recovery apparatus 28 according to the modification 2 of the second embodiment, the configuration of the recovery container 281 may be different from that of the target recovery apparatus 28 of the modification 2 of the first embodiment.

Regarding the configuration of the EUV light generation device 1 according to the modification 2 of the second embodiment, description of the configuration that is the same as the configuration of the EUV light generation device 1 of the modification 2 of the first embodiment is omitted.

Figure 8:
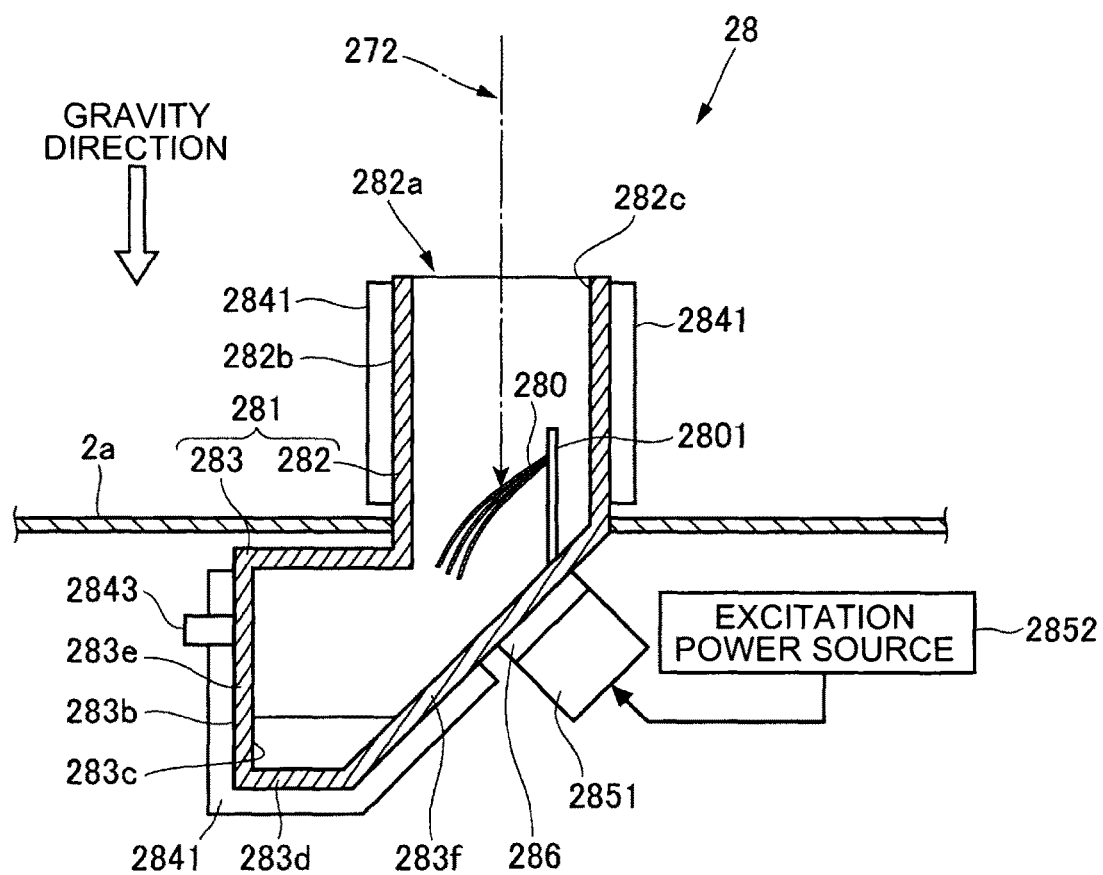
FIG. 8 is a drawing for explaining a target recovery apparatus provided to an EUV light generation device of a modification 2 of the second embodiment.

FIG. 8 is a drawing for explaining the target recovery apparatus 28 provided to the EUV light generation device 1 of the embodiment 2 of the second embodiment.

Regarding the recovery container 281 of FIG. 8, the inclined portion 283f of the tank 283 may not be formed in a bulk shape. The inclined portion 283f may be formed to have a thin plate thickness, similar to the bottom portion 283d and the lateral portion 283e of the tank 283.

The support member 2801 may be connected with the inner wall surface 283c of the inclined portion 283f of the tank 283.

The heat transfer suppression member 286 may be connected with the outer wall surface 283b of the inclined portion 283f of the tank 283.

The other part of the configuration of the heat transfer suppression member 286 may be the same as that of the heat transfer suppression member 286 of the target recovery apparatus 28 of the second embodiment illustrated in FIG. 6.

The excitation device 2851 may be disposed outside the chamber 2 and the recovery container 281.

The excitation device 2851 may be connected with the outer wall surface 283b of the inclined portion 283f of the tank 283, via the heat transfer suppression member 286.

The excitation power source 2852 may be disposed outside the chamber 2 and the recovery container 281.

The excitation power source 2852 may be electrically connected with the excitation device 2851 not via a feedthrough.

The other part of the configuration of the target recovery apparatus 28 according to the modification 2 of the second embodiment may be the same as that of the target recovery apparatus 28 of the modification 2 of the first embodiment.

With this configuration, the excitation device 2851 can be disposed outside the chamber 2 and the recovery container 281, and heat transmission from the recovery container 281 can be suppressed by the heat transfer suppression member 286. Accordingly, breakdown of the motor 2851a can be further suppressed, and durability of the excitation device 2851 can be further improved.

Furthermore, the excitation device 2851 can be connected with the outer wall surface 283b of the inclined portion 283f having a thin plate thickness and capable of transmitting vibration easily. Accordingly, the excitation device 2851 can transmit vibration to the support member 2801 supporting the receiver 280 not via the vibration transmission member 2853 but via the outer wall surface 283b. In other words, the excitation device 2851 can vibrate the receiver 280 via the outer wall surface of the recovery container 281.

The support member 2801 can transmit vibration from the excitation device 2851 while suppressing attenuation of the vibration, and amplify the amplitude of the vibration. The receiver 280 can vibrate with large amplitude.

Consequently, the target recovery apparatus 28 according to the modification 2 of the second embodiment can suppress accumulation of the target 27 on the receiver 280 further stably.

8. Target Recovery Apparatus Provided to EUV Light Generation Device of Third Embodiment A target recovery apparatus 28 provided to an EUV light generation device 1 according to a third embodiment will be described with reference to FIG. 9.

In the target recovery apparatus 28 of the third embodiment, the configuration of the heat transfer suppression member 286 may be different from that of the target recovery apparatus 28 of the second embodiment.

Regarding the configuration of the EUV light generation device 1 of the third embodiment, description of the configuration that is the same as the configuration of the EUV light generation device 1 of the second embodiment is omitted.

[8.1 Configuration]

Figure 9:
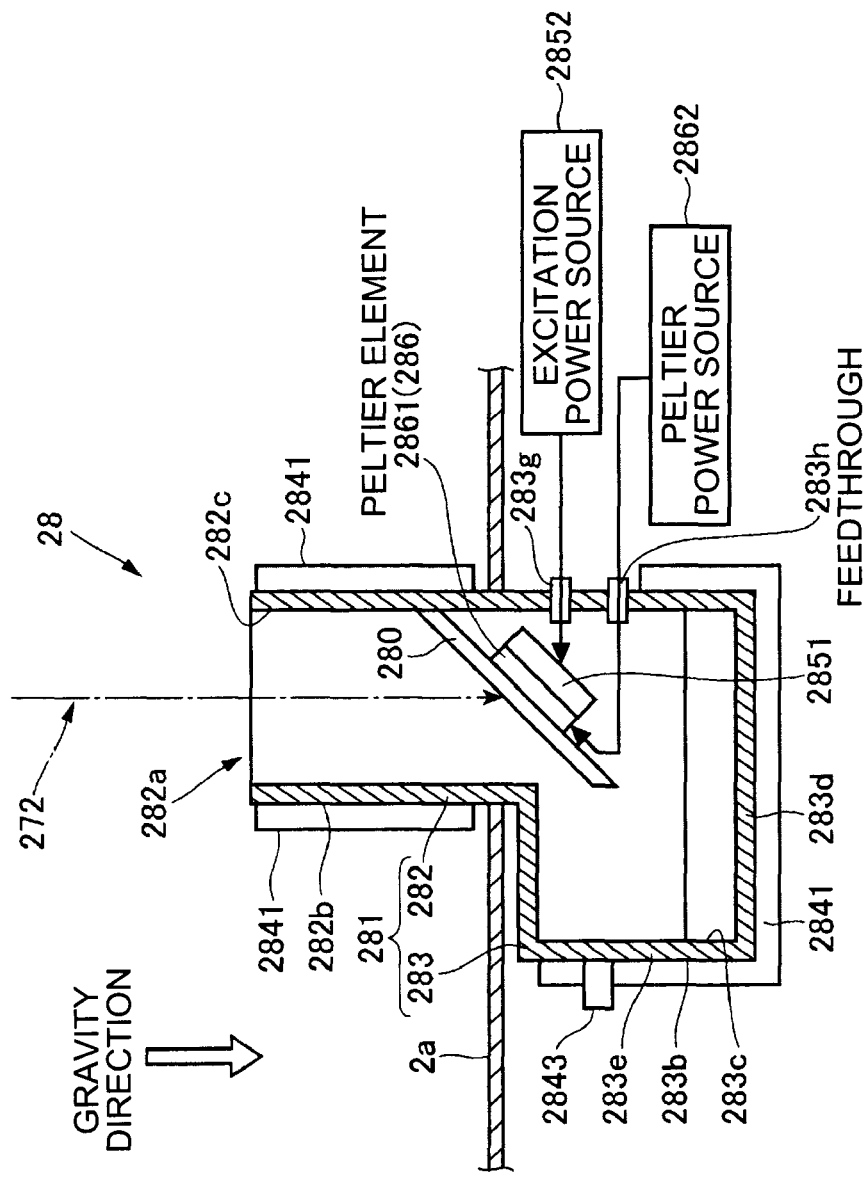
FIG. 9 is a drawing for explaining a target recovery apparatus provided to an EUV light generation device of a third embodiment.

FIG. 9 is a drawing for explaining a target recovery apparatus 28 provided to an EUV light generation device 1 of a third embodiment.

The heat transfer suppression member 286 of FIG. 9 may be replaced with a Peltier element 2861.

This means that the Peltier element 2861 may be disposed between the receiver 280 and the excitation device 2851.

A Peltier power source 2862 may be electrically connected with the Peltier element 2861 via a feedthrough 283h penetrating the lateral portion 283e of the tank 283.

The Peltier power source 2862 may be electrically connected with the EUV light generation controller 5, although not illustrated.

The other part of the configuration of the target recovery apparatus 28 of the third embodiment may be the same as that of the target recovery apparatus 28 of the second embodiment.

[8.2 Operation]

Operation of the target recovery apparatus 28 of the third embodiment will be described.

Regarding the operation of the target recovery apparatus 28 of the third embodiment, description of the operation that is the same as the operation of the target recovery apparatus 28 according to the first and the second embodiments is omitted.

The EUV light generation controller 5 may control the Peltier power source 2862 such that the Peltier element 2861 operates during operation of the heating device 2841.

In the Peltier element 2861, heat generated by driving the motor 2851a included in the excitation device 2851 can be transmitted to the connecting portion with the excitation device 2851.

The Peltier element 2861 may transmit the heat transmitted to the connecting portion with the excitation device 2851, to the receiver 280. Thereby, the excitation device 2851 may be cooled and the receiver 280 may be heated.

The other part of the operation of the target recovery apparatus 28 of the third embodiment may be the same as that of the target recovery apparatus 28 of the first and the second embodiments.

[8.3 Effect]

In the target recovery apparatus 28 of the third embodiment, as the receiver 280 can be heated by the Peltier element 2861, power consumption of the heating power source 2842 that supplies electrical power to the heating device 2841 can be reduced.

Meanwhile, in the target recovery apparatus 28 of the third embodiment, as the excitation device 2851 can be cooled by the Peltier element 2861, breakdown of the motor 2851a included in the excitation device 2851 can be further suppressed.

[8.4 Modification 1 of Third Embodiment]

A target recovery apparatus 28 provided to an EUV light generation device 1 of a modification 1 of the third embodiment will be described with reference to FIG. 10.

In the target recovery apparatus 28 of the modification 1 of the third embodiment, the configuration of the heat transfer suppression member 286 may be mainly different from that of the target recovery apparatus 28 of the modification 2 of the second embodiment.

Regarding the configuration of the EUV light generation device 1 of the modification 1 of the third embodiment, description of the configuration that is the same as the configuration of the EUV light generation device 1 of the modification 2 of the second embodiment is omitted.

Figure 10:
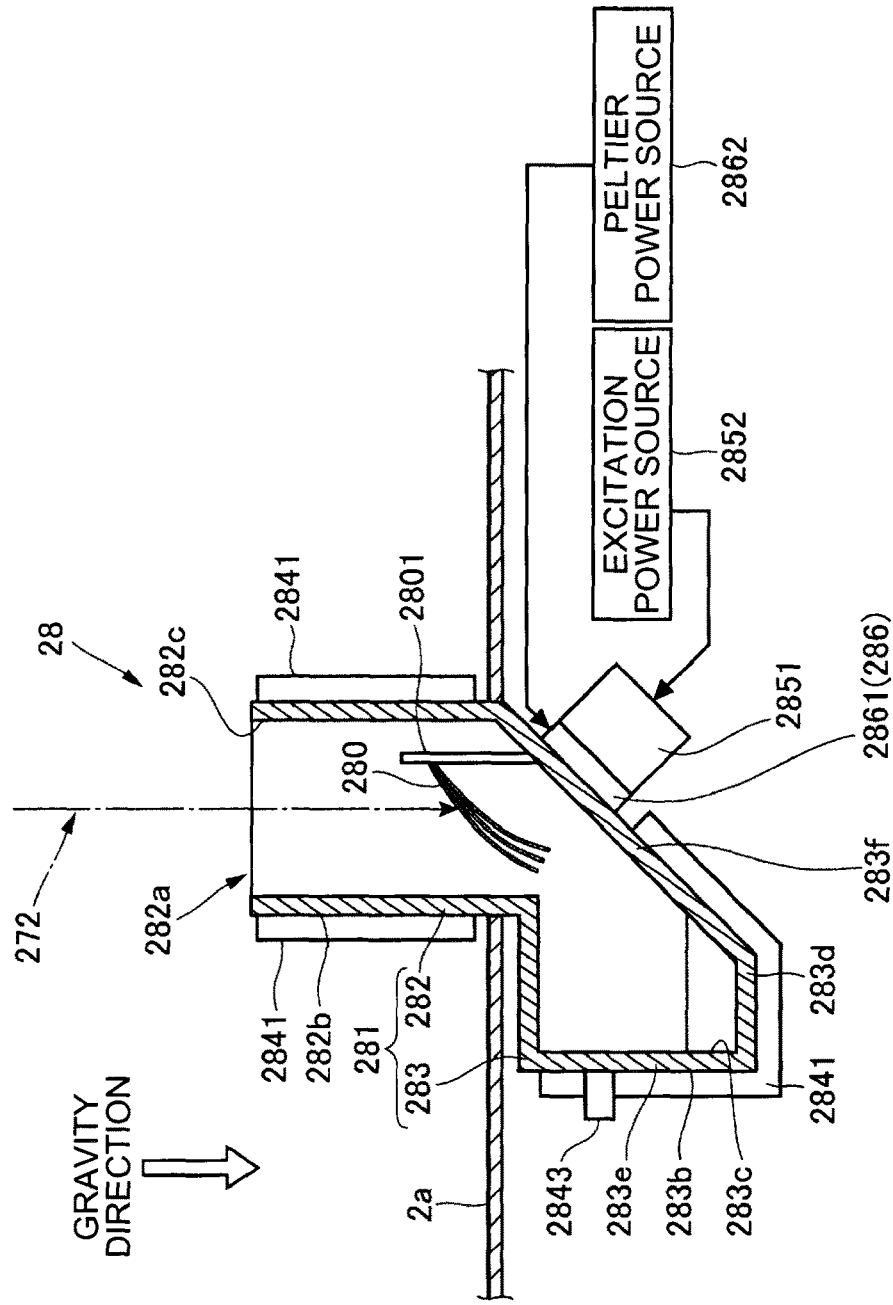
FIG. 10 is a drawing for explaining a target recovery apparatus provided to an EUV light generation device of a modification 1 of the third embodiment.

FIG. 10 is a drawing for explaining the target recovery apparatus 28 provided to the EUV light generation device 1 of the modification 1 of the third embodiment.

The heat transfer suppression member 286 of FIG. 10 may be replaced with the Peltier element 2861.

Accordingly, the Peltier element 2861 may be disposed outside the chamber 2 and the recovery container 281, and may be connected with the outer wall surface 283b of the inclined portion 283f of the tank 283.

The other part of the configuration of the Peltier element 2861 may be the same as that of the Peltier element 2861 of the target recovery apparatus 28 of the third embodiment illustrated in FIG. 9.

The Peltier power source 2862 may be disposed outside the chamber 2 and the recovery container 281, and may be electrically connected with the Peltier element 2861 not via a feedthrough.

The other part of the configuration of the Peltier power source 2862 may be the same as that of the Peltier element 2861 of the target recovery apparatus 28 of the third embodiment illustrated in FIG. 9.

The other part of the configuration of the target recovery apparatus 28 of the modification 1 of the third embodiment may be the same as that of the target recovery apparatus 28 of the modification 2 of the second embodiment.

With this configuration, the Peltier element 2861 may transmit the heat transmitted to the connecting portion with the excitation device 2851, to the tank 283. Thereby, the excitation device 2851 may be cooled and the tank 283 may be heated. As the heat transmitted to the tank 283 by the Peltier element 2861 can be transmitted to the receiver 280 via the support member 2801, the receiver 280 can be heated.

Consequently, the target recovery apparatus 28 of the modification 1 of the third embodiment can reduce power consumption of the heating power source 2842 that supplies electrical power to the heating device 2841, and can further suppress breakdown of the motor 2851a included in the excitation device 2851.

9. Target Recovery Apparatus Provided to EUV Light Generation Device of Fourth Embodiment A target recovery apparatus 28 provided to an EUV light generation device 1 of a fourth embodiment will be described with reference to FIG. 11.

The target recovery apparatus 28 of the fourth embodiment may be configured such that a cooling mechanism 287 is added to the target recovery apparatus 28 of the second embodiment.

Regarding the configuration of the EUV light generation device 1 of the fourth embodiment, description of the configuration same as the configuration of the EUV light generation device 1 of the second embodiment is omitted.

[9.1 Configuration]

Figure 11:
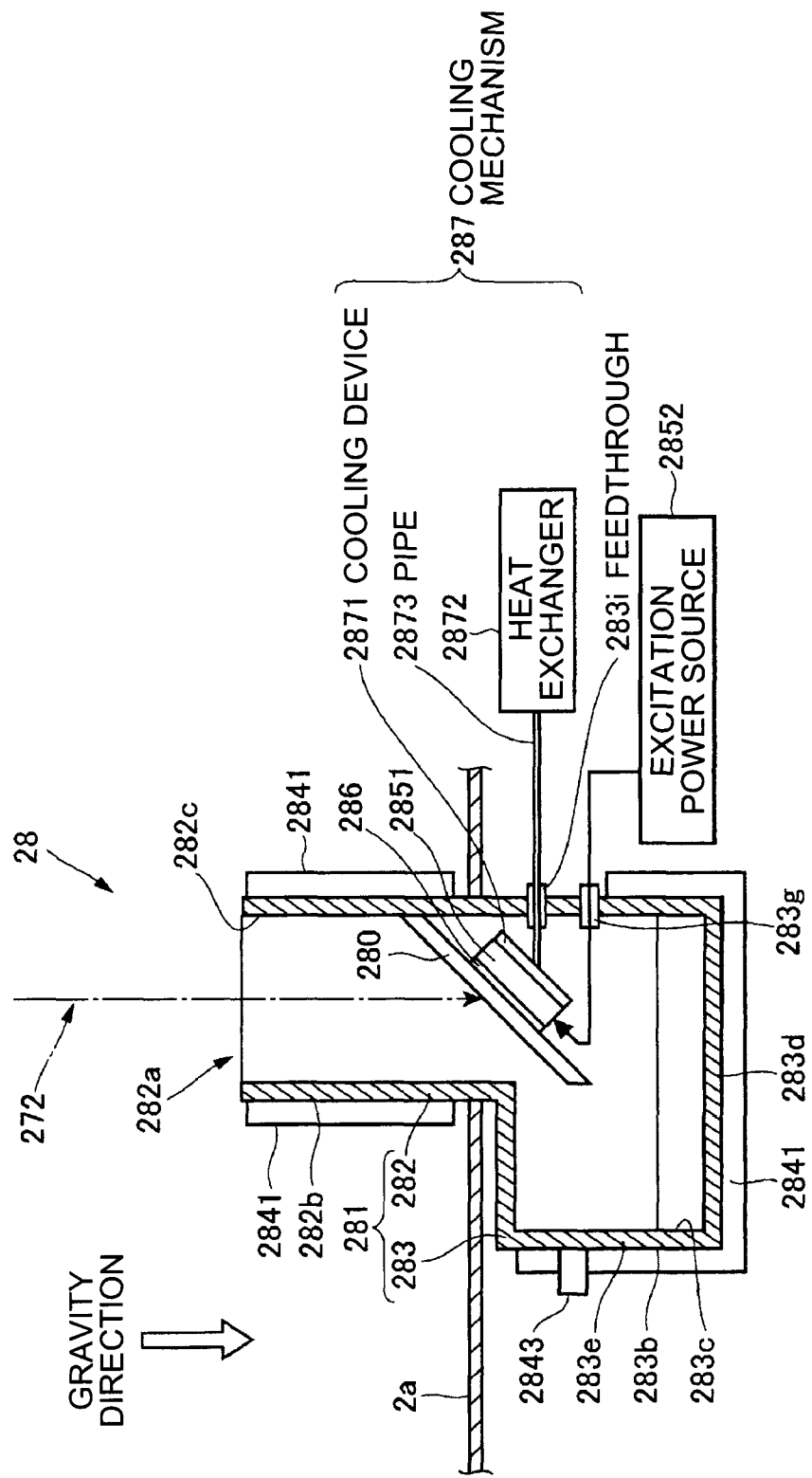
FIG. 11 is a drawing for explaining a target recovery apparatus provided to an EUV light generation device of a fourth embodiment.

FIG. 11 is a drawing for explaining the target recovery apparatus 28 provided to the EUV light generation device 1 of the fourth embodiment.

The cooling mechanism 287 of FIG. 11 may be a mechanism for cooling the excitation device 2851.

The cooling mechanism 287 may include a cooling device 2871, a heat exchanger 2872, and a pipe 2873.

The cooling device 2871 may be a member in which a refrigerant flow path is formed inside thereof. Refrigerant flowing through the refrigerant flow path may be water, for example.

The cooling device 2871 may be made of metal having high heat conductivity.

The cooling device 2871 may be connected with a surface of the excitation device 2851 located opposite to the heat transfer suppression member 286.

The pipe 2873 may provide communication between a refrigerant flow path inside the cooling device 2871 and a refrigerant flow path inside the heat exchanger 2872.

The pipe 2873 may be disposed to pass through a feedthrough 283i penetrating the lateral portion 283e of the tank 283.

The heat exchanger 2872 may circulate refrigerant in a loop formed of the refrigerant flow path inside the heat exchanger 2872, the refrigerant flow path inside the cooling device 2871, and the pipe 2873.

The heat exchanger 2872 may be electrically connected with the EUV light generation controller 5, although not illustrated.

The other part of the configuration of the target recovery apparatus 28 of the fourth embodiment may be the same as that of the target recovery apparatus 28 of the second embodiment.

[9.2 Operation]

Operation of the target recovery apparatus 28 according to the fourth embodiment will be described.

Regarding the operation of the target recovery apparatus 28 according to the fourth embodiment, description of the operation that is the same as the operation of the target recovery apparatus 28 according to the first and the second embodiments is omitted.

The EUV light generation controller 5 may control the heat exchanger 2872 such that refrigerant in the refrigerant flow path in the cooling device 2871 flows, during the operation of the heating device 2841.

The heat exchanger 2872 may cool the refrigerant by discharging the heat of the refrigerant flowing from the cooling device 2871, to the atmospheric air. The heat exchanger 2872 may allow the cooled refrigerant to flow to the cooling device 2871. Thereby, the excitation device 2851 connected with the cooling device 2871 can be cooled.

The other part of the operation of the target recovery apparatus 28 according to the fourth embodiment may be the same as that of the target recovery apparatus 28 according to the first and the second embodiments.

[9.3 Effect]

The target recovery apparatus 28 of the fourth embodiment can cool the excitation device 2851 by the cooling device 2871 and the heat exchanger 2872. Accordingly, breakdown of the motor 2851a included in the excitation device 2851 can be further suppressed.

[9.4 Modification 1 of Fourth Embodiment]

A target recovery apparatus 28 provided to an EUV light generation device 1 according to a modification 1 of the fourth embodiment will be described with reference to FIG. 12.

The target recovery apparatus 28 according to the modification 1 of the fourth embodiment may be configured such that the cooling mechanism 287 is added to the target recovery apparatus 28 of the modification 1 of the second embodiment.

Regarding the configuration of the EUV light generation device 1 according to the modification 1 of the fourth embodiment, description of the configuration that is the same as the configuration of the EUV light generation device 1 according to the modification 1 of the second embodiment is omitted.

Figure 12:
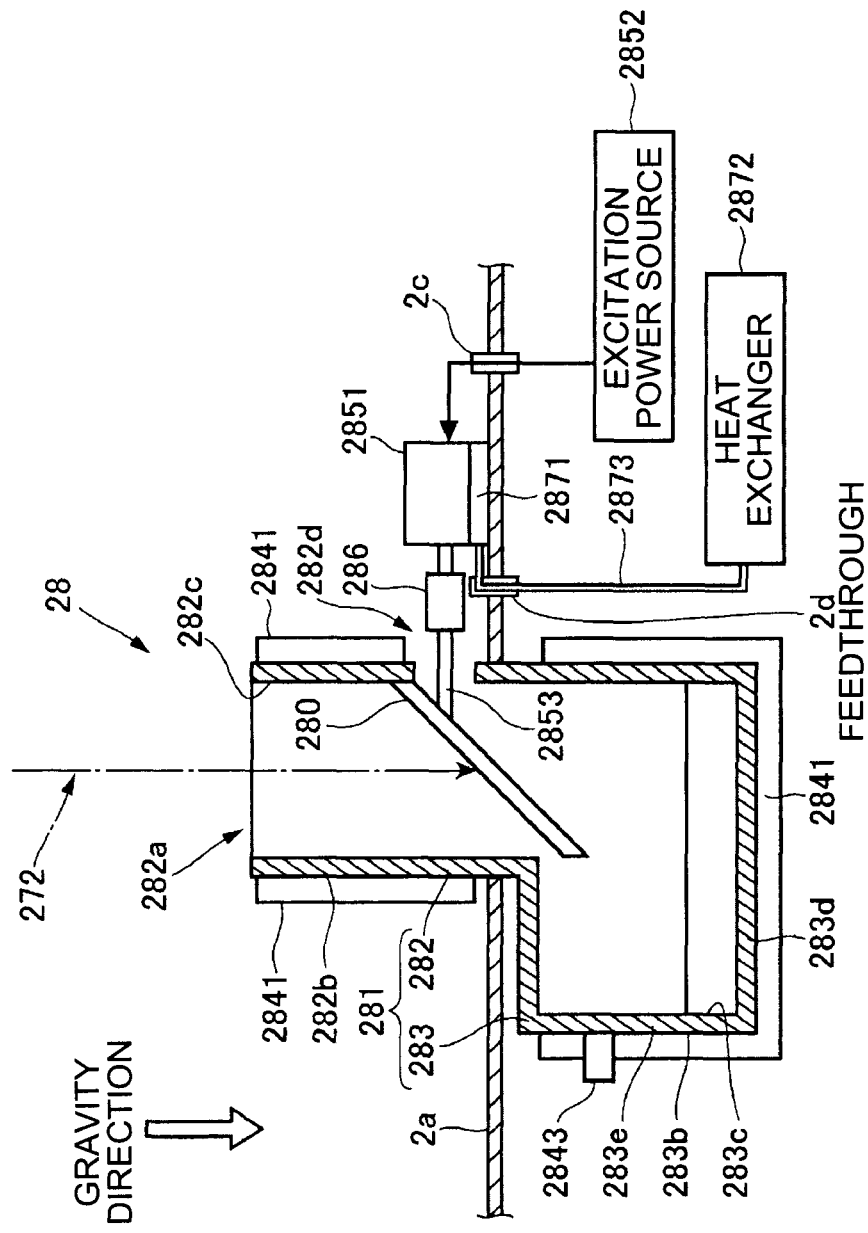
FIG. 12 is a drawing for explaining a target recovery apparatus provided to an EUV light generation device of a modification 1 of the fourth embodiment.

FIG. 12 is a drawing for explaining the target recovery apparatus 28 provided to the EUV light generation device 1 of the modification 1 of the fourth embodiment.

The cooling device 2871 included in the cooling mechanism 287 of FIG. 12 may be disposed between the wall 2a of the chamber 2 and the excitation device 2851.

The pipe 2873 may be disposed to pass thorough the feedthrough 2d penetrating the wall 2a of the chamber 2.

The other part of the configuration of the cooling mechanism 287 may be the same as that of the cooling mechanism 287 of the target recovery apparatus 28 according to the fourth embodiment illustrated in FIG. 11.

The other part of the configuration of the target recovery apparatus 28 according to the modification 1 of the fourth embodiment may be the same as that of the target recovery apparatus 28 according to the modification 1 of the second embodiment.

With this configuration, the target recovery apparatus 28 according to the modification 1 of the fourth embodiment can cool the excitation device 2851 by the cooling device 2871 and the heat exchanger 2872. Accordingly, breakdown of the motor 2851a included in the excitation device 2851 can be further suppressed.

[9.5 Modification 2 of Fourth Embodiment]

A target recovery apparatus 28 provided to an EUV light generation device 1 according to a modification 2 of the fourth embodiment will be described with reference to FIG. 13.

The target recovery apparatus 28 according to the modification 2 of the fourth embodiment may be configured such that the cooling mechanism 287 is added to the target recovery apparatus 28 of the modification 2 of the second embodiment.

Regarding the configuration of the EUV light generation device 1 according to the modification 2 of the fourth embodiment, description of the configuration that is the same as the configuration of the EUV light generation device 1 of the modification 2 of the second embodiment is omitted.

Figure 13:
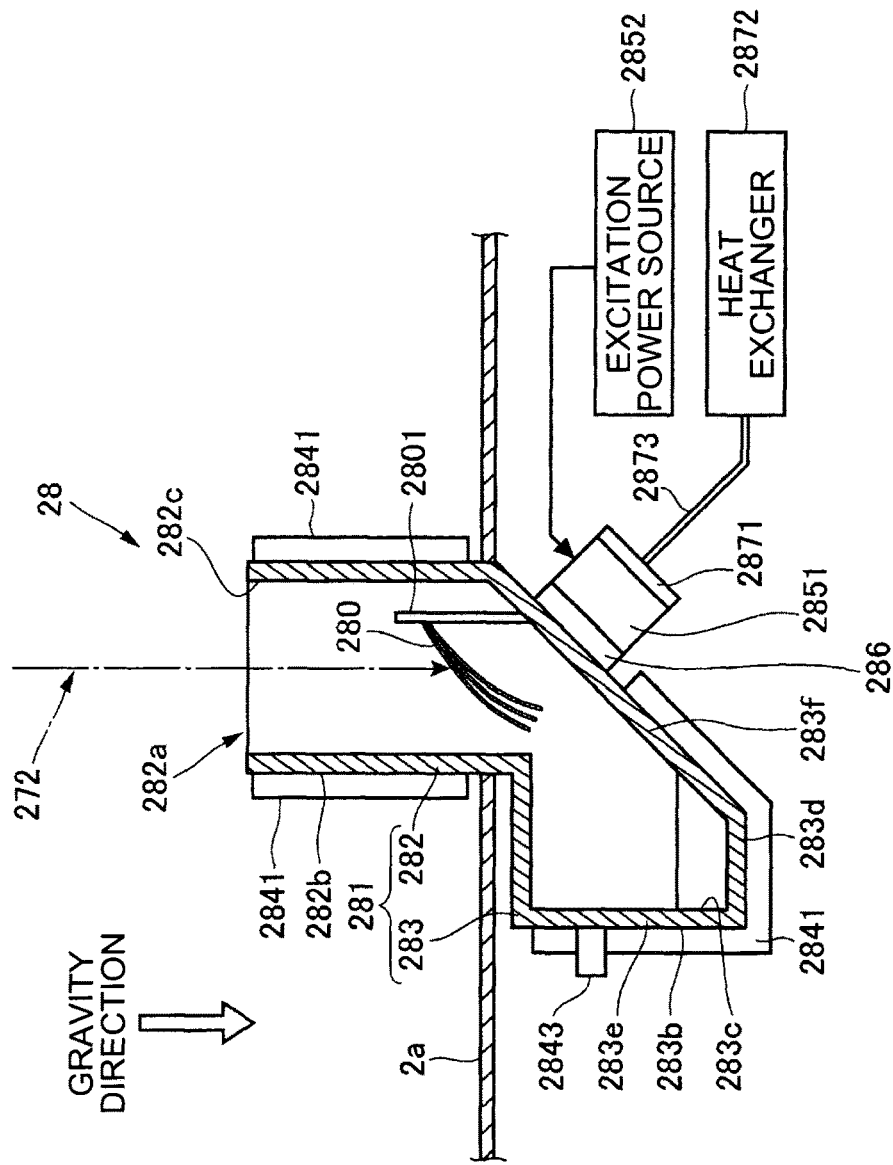
FIG. 13 is a drawing for explaining a target recovery apparatus provided to an EUV light generation device of a modification 2 of the fourth embodiment.

FIG. 13 is a drawing for explaining the target recovery apparatus 28 provided to the EUV light generation device 1 of the modification 2 of the fourth embodiment.

The cooling device 2871 included in the cooling mechanism 287 of FIG. 13 may be connected with a surface of the excitation device 2851 located opposite to the heat transfer suppression member 286.

The pipe 2873 may provide direct communication between the cooling device 2871 and the heat exchanger 2872.

The other part of the configuration of the cooling mechanism 287 may be the same as that of the cooling mechanism 287 of the target recovery apparatus 28 of the fourth embodiment illustrated in FIG. 11.

The other part of the configuration of the target recovery apparatus 28 according to the modification 2 of the fourth embodiment may be the same as that of the target recovery apparatus 28 of the modification 2 of the second embodiment.

With this configuration, the target recovery apparatus 28 according to the modification 2 of the fourth embodiment can cool the excitation device 2851 by the cooling device 2871 and the heat exchanger 2872. Accordingly, breakdown of the motor 2851a included in the excitation device 2851 can be further suppressed.

10. Target Recovery Apparatus Provided to EUV Light Generation Device of Fifth Embodiment A target recovery apparatus 28 provided to an EUV light generation device 1 of a fifth embodiment will be described with reference to FIG. 14.

The target recovery apparatus 28 according to the fifth embodiment may be configured such that a vibration damping member 288 is added to the target recovery apparatus 28 of the second embodiment.

Regarding the configuration of the EUV light generation device 1 of the fifth embodiment, description of the configuration that is the same as the configuration of the EUV light generation device 1 of the second embodiment is omitted.

Figure 14:
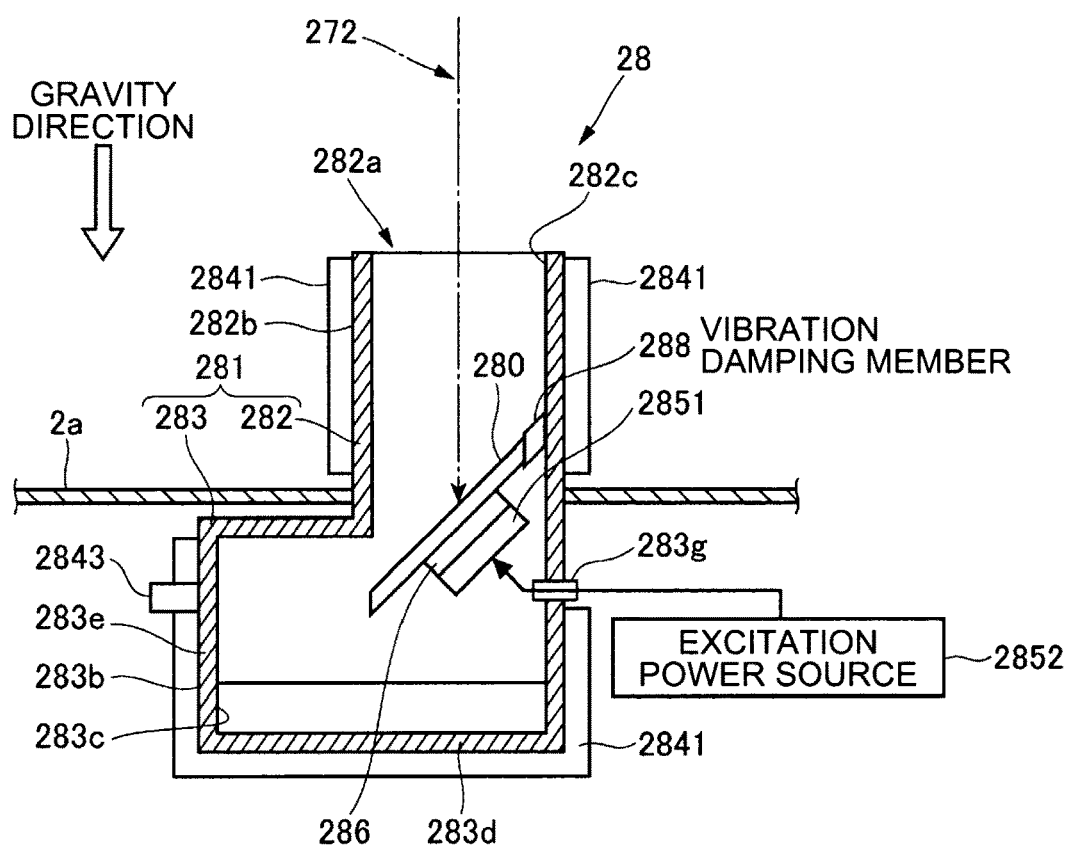
FIG. 14 is a drawing for explaining a target recovery apparatus provided to an EUV light generation device of a fifth embodiment.

FIG. 14 is a drawing for explaining the target recovery apparatus 28 provided to the EUV light generation device 1 of the fifth embodiment.

The receiver 280 of FIG. 14 may be supported on the inner wall surface 282c of the cylindrical portion 282 via the vibration damping member 288.

The vibration damping member 288 may be an elastic body configured to attenuate the vibration.

The vibration damping member 288 may be made of a material having high heat conductivity.

The vibration damping member 288 may be made of vibration-proof silicone rubber or heat conductive silicone rubber, for example, or may be made of a metallic member having empty holes such as porosity metal made of metal such as aluminum or nickel. Moreover, the vibration damping member 288 may be formed using a metallic spring member.

The other part of the configuration of the target recovery apparatus 28 according to the fifth embodiment may be the same as that of the target recovery apparatus 28 of the second embodiment.

With this configuration, the vibration damping member 288 can suppress transmission of vibration of the receiver 280 to other constitutional elements of the target recovery apparatus 28 such as the cylindrical portion 282 and the tank 283.

Thereby, the vibration damping member 288 can suppress transmission of vibration of the receiver 280 to the chamber 2 to which the target recovery apparatus 28 is fixed or to the target supply device 26 fixed to the chamber 2.

Consequently, the target recovery apparatus 28 of the fifth embodiment can suppress disturbance of the target trajectory 272 caused by the chamber 2 or the target supply device 26 being vibrated.

[10.1 Modification 1 of Fifth Embodiment]

A target recovery apparatus 28 provided to an EUV light generation device 1 according to a modification 1 of the fifth embodiment will be described with reference to FIG. 15.

The target recovery apparatus 28 according to the modification 1 of the fifth embodiment may be configured such that the vibration damping member 288 is added to the target recovery apparatus 28 of the modification 1 of the second embodiment.

Regarding the configuration of the EUV light generation device 1 according to the modification 2 of the fifth embodiment, description of the configuration that is the same as the configuration of the EUV light generation device 1 of the modification 1 of the second embodiment is omitted.

Figure 15:
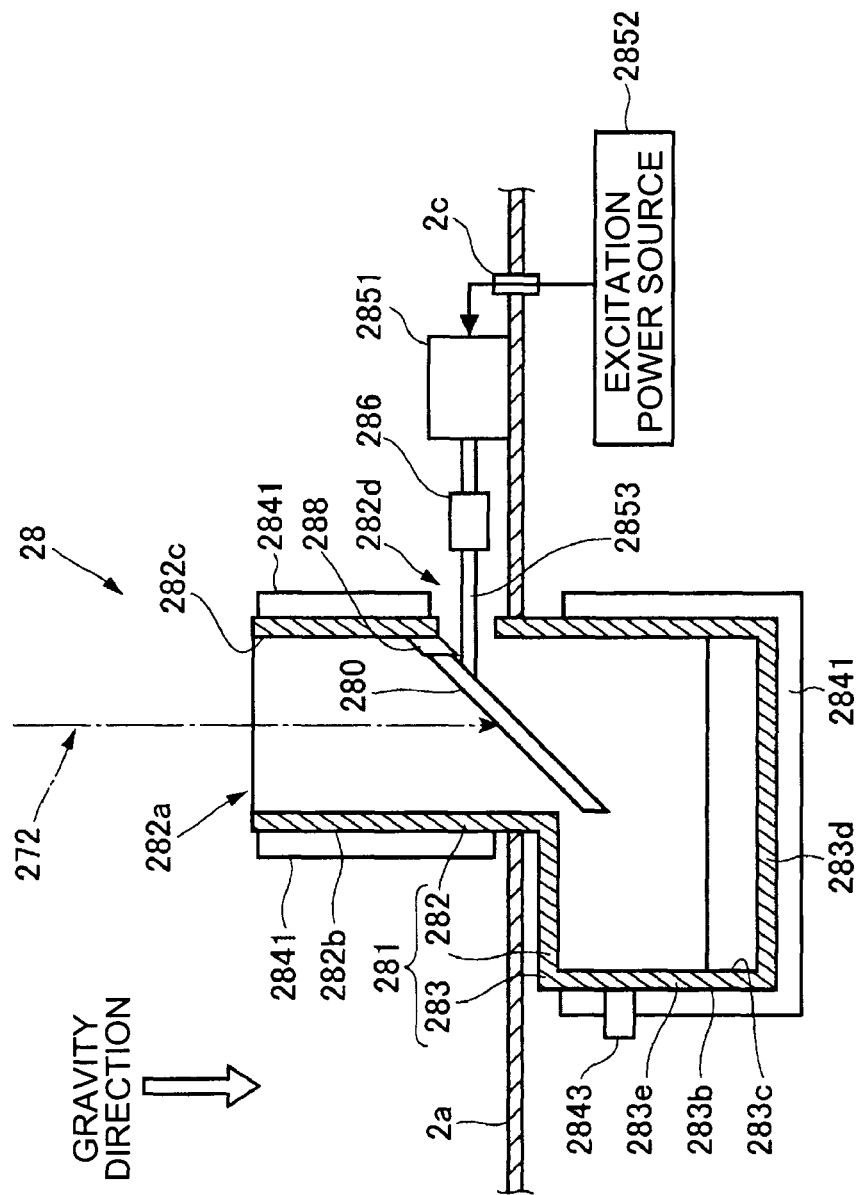
FIG. 15 is a drawing for explaining a target recovery apparatus provided to an EUV light generation device of a modification 1 of the fifth embodiment.

FIG. 15 is a drawing for explaining the target recovery apparatus 28 provided to the EUV light generation device 1 according to the modification 1 of the fifth embodiment.

The vibration damping member 288 of FIG. 15 may be disposed between the inner wall surface 282c of the cylindrical portion 282 and the receiver 280, which is the same as the vibration damping member 288 illustrated in FIG. 14.

The other part of the configuration of the vibration damping member 288 may be the same as that of the vibration damping member 288 of the target recovery apparatus 28 of the fourth embodiment illustrated in FIG. 14.

The other part of the configuration of the target recovery apparatus 28 according to the modification 1 of the fifth embodiment may be the same as that of the target recovery apparatus 28 of the modification 1 of the second embodiment.

With this configuration, the vibration damping member 288 can suppress transmission of vibration of the receiver 280 to other constituent elements of the target recovery apparatus 28.

Consequently, the target recovery apparatus 28 of the modification 1 of the fifth embodiment can suppress disturbance of the target trajectory 272 which may be caused by transmission of the vibration of the receiver 280 to the chamber 2 or the target supply device 26.

[10.2 Modification 2 of Fifth Embodiment]

A target recovery apparatus 28 to an EUV light generation device 1 according to a modification 2 of the fifth embodiment will be described with reference to FIG. 16.

The target recovery apparatus 28 according to the modification 2 of the fifth embodiment may be configured such that the vibration damping member 288 is added to the target recovery apparatus 28 of the modification 2 of the second embodiment.

Regarding the configuration of the EUV light generation device 1 according to the modification 2 of the fifth embodiment, description of the configuration that is the same as the configuration of the EUV light generation device 1 of the modification 2 of the second embodiment is omitted.

Figure 16:
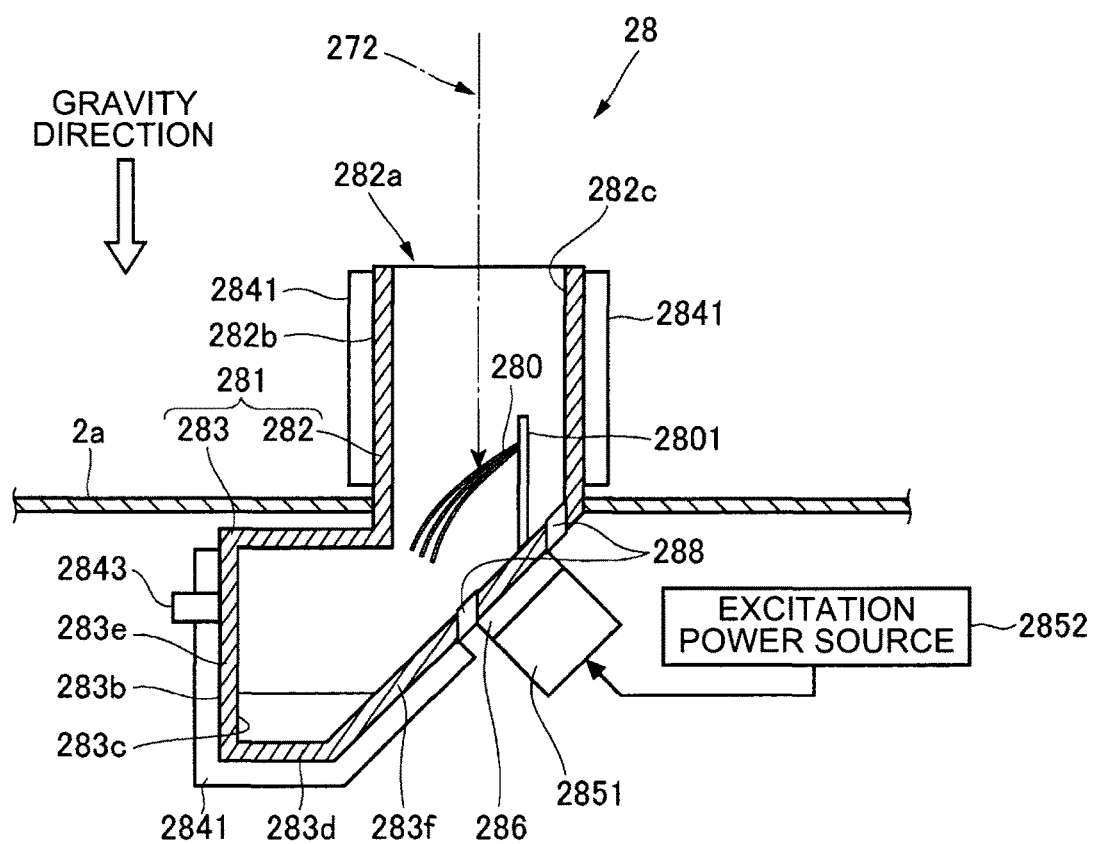
FIG. 16 is a drawing for explaining a target recovery apparatus provided to an UV light generation device of a modification 2 of the fifth embodiment.

FIG. 16 is a drawing for explaining the target recovery apparatus 28 provided to the EUV light generation device 1 according to the modification 2 of the fifth embodiment.

The vibration damping member 288 of FIG. 16 may be disposed as part of the inclined portion 283f of the tank 283. The vibration damping member 288 may be disposed as part of the inclined portion 283f in the inclined portion 283f, around the area occupied by the heat transfer suppression member 286 connected with the excitation device 2851. To the inner wall surface 283c in the region occupied by the heat transfer suppression member 286 of the inclined portion 283f, the support member 2801 supporting the receiver 280 may be connected.

The vibration damping member 288 may be made of a material having airtightness. The vibration damping member 288 may be made of vibration-proof silicone rubber or heat conductive silicone rubber, for example.

The vibration damping member 288 may be disposed such that airtightness in the tank 283 can be secured.

From the viewpoint of airtightness in the tank 283, it is preferable that the vibration damping member 288 is not a metallic member having empty holes such as porosity metal or a metallic spring member, unlike the vibration damping member 288 illustrated in FIG. 14.

The other part of the configuration of the vibration damping member 288 may be the same as that of the vibration damping member 288 of the target recovery apparatus 28 of the second embodiment illustrated in FIG. 14.

The other part of the configuration of the target recovery apparatus 28 according to the modification 2 of the fifth embodiment may be the same as that of the target recovery apparatus 28 of the modification 2 of the second embodiment.

With this configuration, the vibration damping member 288 can suppress transmission of vibration of the excitation device 2851 and the receiver 280 to other constituent elements of the target recovery apparatus 28 such as the cylindrical portion 282 and the tank 283.

Thereby, the vibration damping member 288 can suppress transmission of the vibration of the excitation device 2851 and the receiver 280 to the chamber 2 to which the target recovery apparatus 28 is fixed and the target supply device 26 fixed to the chamber 2.

Consequently, the target recovery apparatus 28 of the modification 2 of the fifth embodiment can suppress disturbance of the target trajectory 272 caused by the chamber 2 and the target supply device 26 being vibrated.

11. Target Recovery Apparatus Provided to EUV Light Generation Device of Sixth Embodiment A target recovery apparatus 28 provided to an EUV light generation device 1 of a sixth embodiment will be described with reference to FIG. 17 to 18C.

In the target recovery apparatus 28 of the sixth embodiment, configurations of the recovery container 281 and the vibration damping member 288 may be different from those of the target recovery apparatus 28 of the fifth embodiment.

Regarding the configuration of the EUV light generation device 1 of the sixth embodiment, description of the configuration that is the same as the configuration of the EUV light generation device 1 of the fifth embodiment is omitted.

Figure 17:
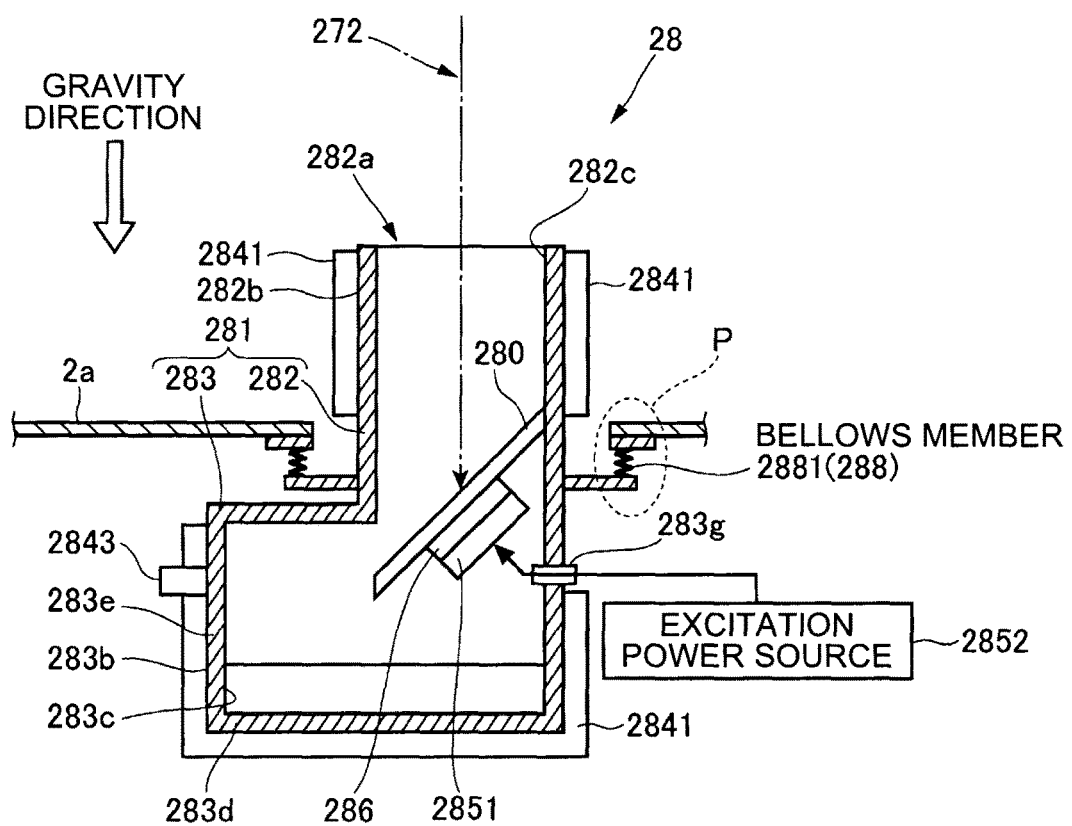
FIG. 17 is a drawing for explaining a target recovery apparatus provided to an UV light generation device of a sixth embodiment.
Figure 18A:
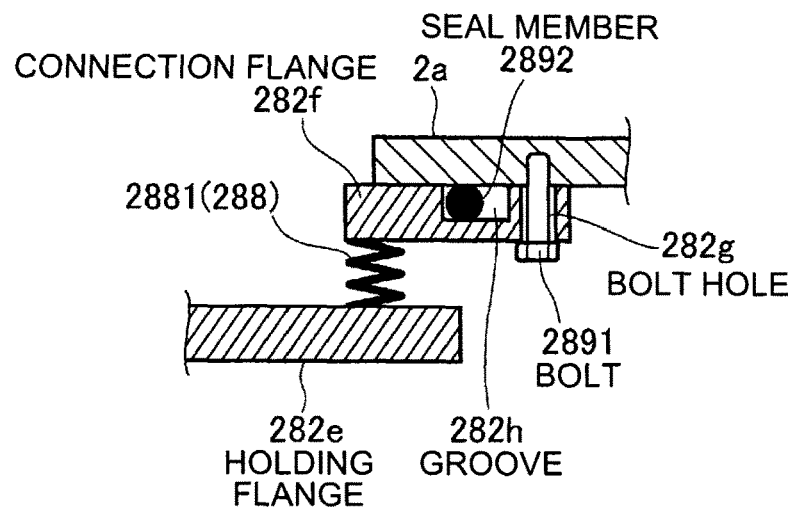
FIG. 18A is an enlarged view of a part P illustrated in FIG. 17, which is a drawing for explaining an exemplary configuration 1 of a vibration damping member.
Figure 18B:
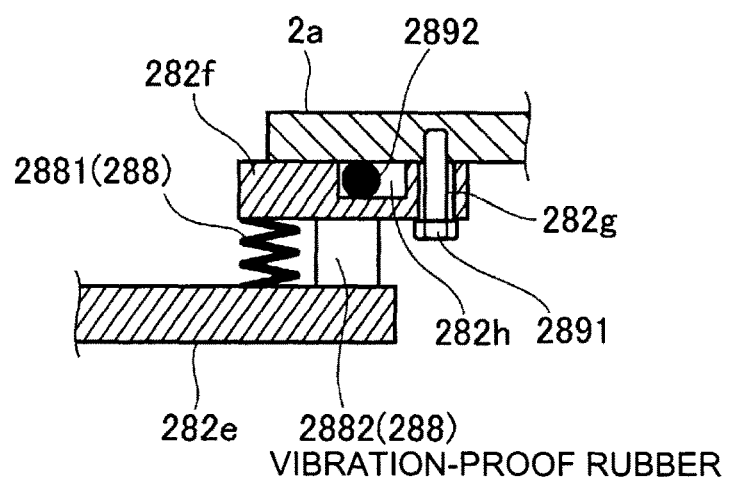
FIG. 18B is an enlarged view of the part P illustrated in FIG. 17, which is a drawing for explaining an exemplary configuration 2 of a vibration damping member.
Figure 18C:
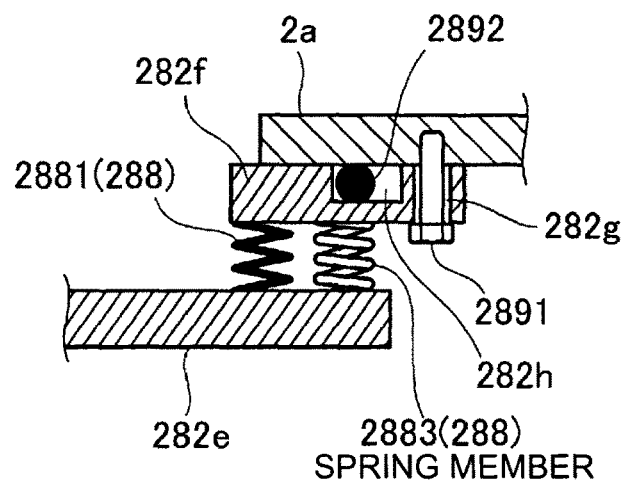
FIG. 18C is an enlarged view of the part P illustrated in FIG. 17, which is a drawing for explaining an exemplary configuration 3 of a vibration damping member.

FIG. 17 is a drawing for explaining the target recovery apparatus 28 provided to the EUV light generation device 1 of the sixth embodiment. FIG. 18A is an enlarged view of a part P illustrated in FIG. 17, for explaining an exemplary configuration 1 of the vibration damping member 288. FIG. 18B is an enlarged view of the part P illustrated in FIG. 17, for explaining an exemplary configuration 2 of the vibration damping member 288. FIG. 18C is an enlarged view of the part P illustrated in FIG. 17, for explaining an exemplary configuration 3 of the vibration damping member 288.

The recovery container 281 of FIG. 17 may be provided with a holding flange 282e and a connection flange 282f.

The holding flange 282e may be formed in a brim shape. The holding flange 282e may be formed to protrude from the outer wall surface 282b of the cylindrical portion 282 toward the outside in the radial direction. The holding flange 282e may be formed in a protruding manner so as to be substantially orthogonal to the target trajectory 272.

The holding flange 282e may be integrally formed with the cylindrical portion 282.

The holding flange 282e may be made of a material that is the same as that of the cylindrical portion 282 and the tank 283.

The holding flange 282e may be provided to the tank 283.

The connection flange 282f may be a flange for connecting the target recovery apparatus 28 to the chamber 2.

The connection flange 282f may be formed in a ring shape.

The connection flange 282f may be made of a material that is the same as that of the cylindrical portion 282 and the tank 283.

The connection flange 282f may have a bolt hole 282g and a groove 282h illustrated in FIG. 18A.

The bolt hole 282g may be a hole to which a bolt 2891 for fixing the connection flange 282f to the wall 2a of the chamber 2 is screwed.

The groove 282h may be a groove for airtightly arranging a seal member 2892 connecting the connection flange 282f to the wall 2a of the chamber 2. A groove for arranging the seal member 2892 may be formed on the wall 2a of the chamber 2, rather than on the connection flange 282f.

The vibration damping member 288 of FIG. 17 may be disposed between the chamber 2 and the target recovery apparatus 28.

The vibration damping member 288 may be configured to be a bellows member 2881 as illustrated in FIG. 18A.

The bellows member 2881 may be formed in an expandable cylindrical shape.

The bellows member 2881 may be made of a material having elasticity.

The bellows member 2881 may be made of a material that is the same as that of the cylindrical portion 282 and the tank 283.

The bellows member 2881 may be joined airtightly by welding or the like to each of the holding flange 282e and the connection flange 282f.

The bellows member 2881 may connect the holding flange 282e and the connection flange 282f. The chamber 2 and the target recovery apparatus 28 may be connected via the bellows member 2881 that is the vibration damping member 288.

Meanwhile, as illustrated in FIG. 18B, the vibration damping member 288 may be configured such that vibration-proof rubber 2882 is added to the outside of the bellows member 2881 illustrated in FIG. 18A.

The vibration-proof rubber 2882 may be made of vibration-proof silicone rubber described above.

The vibration-proof rubber 2882 may be disposed at a plurality of positions so as to surround the cylindrical portion 282, between the holding flange 282e and the connection flange 282f.

The vibration damping member 288 may be configured using a metallic member having empty holes described above, instead of the vibration-proof rubber 2882. The metallic member having empty holes may be porosity metal or the like made of metal such as aluminum or nickel.

Meanwhile, as illustrated in FIG. 18C, the vibration damping member 288 may be configured such that a spring member 2883 is added to the outside of the bellows member 2881 illustrated in FIG. 18A.

The spring member 2883 may be a metallic spring member.

The spring member 2883 may be disposed at a plurality of positions so as to surround the cylindrical portion 282, between the holding flange 282e and the connection flange 282f.

The vibration damping member 288 may be configured using a gas spring or a damper such as a hydraulic damper, instead of the spring member 2883.

The other part of the configuration of the target recovery apparatus 28 of the sixth embodiment may be the same as that of the target recovery apparatus 28 of the fifth embodiment.

With this configuration, the vibration damping member 288 can suppress transmission of vibration of the receiver 280 to the chamber 2 connected with the target recovery apparatus 28 and to the target supply device 26 fixed to the chamber 2.

Consequently, the target recovery apparatus 28 of the sixth embodiment can suppress disturbance of the target trajectory 272, which may be caused by vibration of the chamber 2 and the target supply device 26.

[11.1 Modification 1 of Sixth Embodiment]

A target recovery apparatus 28 provided to an EUV light generation device 1 of a modification 1 of the sixth embodiment will be described with reference to FIG. 19.

In the target recovery apparatus 28 of the modification 1 of the sixth embodiment, configurations of the recovery container 281 and the vibration damping member 288 may be mainly different from those of the target recovery apparatus 28 of the modification 1 of the fifth embodiment.

Regarding the configuration of the EUV light generation device 1 of the modification 1 of the sixth embodiment, description of the configuration that is the same as the configuration of the EUV light generation device 1 according to the modification 1 of the fifth embodiment is omitted.

Figure 19:
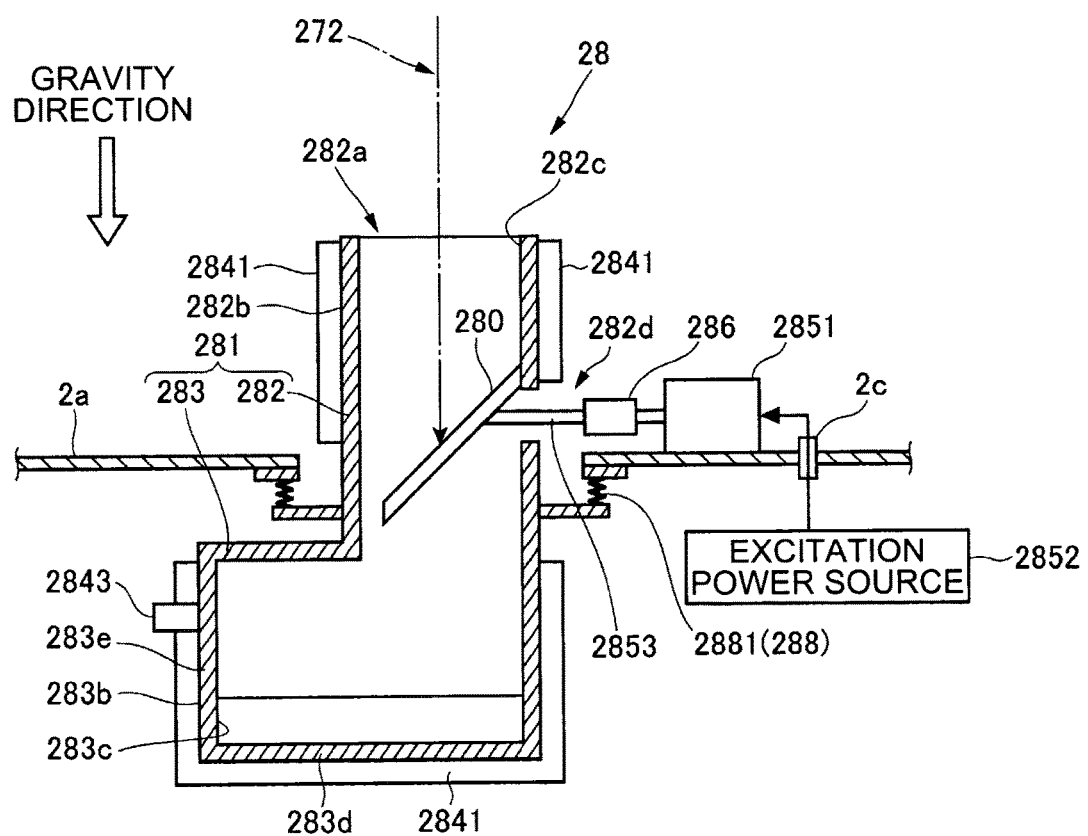
FIG. 19 is a drawing for illustrating a target recovery apparatus provided to an EUV light generation device of a modification 1 of the sixth embodiment.

FIG. 19 is a drawing for explaining the target recovery apparatus 28 provided to the EUV light generation device 1 of the modification 1 of the sixth embodiment.

The recovery container 281 of FIG. 19 may be provided with the holding flange 282e and the connection flange 282f, which is the same as the recovery container 281 illustrated in FIGS. 17 to 18C.

The vibration damping member 288 of FIG. 19 may have a configuration that is the same as the configuration of the vibration damping member 288 illustrated in FIGS. 17 to 18C, and may be disposed between the chamber 2 and the target recovery apparatus 28.

The other part of the configuration of the target recovery apparatus 28 according to the modification 1 of the sixth embodiment may be the same as that of the target recovery apparatus 28 according to the modification 1 of the fifth embodiment.

With this configuration, the vibration damping member 288 can suppress transmission of vibration of the receiver 280 to the chamber 2 and the target supply device 26.

Consequently, the target recovery apparatus 28 of the modification 1 of the sixth embodiment can suppress disturbance of the target trajectory 272 caused by the chamber 2 and the target supply device 26 being vibrated.

[11.2 Modification 2 of Sixth Embodiment]

A target recovery apparatus 28 provided to an EUV light generation device 1 of a modification 2 of the sixth embodiment will be described with reference to FIG. 20.

In the target recovery apparatus 28 of the modification 2 of the sixth embodiment, configurations of the recovery container 281 and the vibration damping member 288 may be mainly different from those of the target recovery apparatus 28 of the modification 2 of the fifth embodiment.

Regarding the configuration of the EUV light generation device 1 of the modification 2 of the sixth embodiment, description of the configuration that is the same as the configuration of the EUV light generation device 1 according to the embodiment 2 of the fifth embodiment is omitted.

Figure 20:
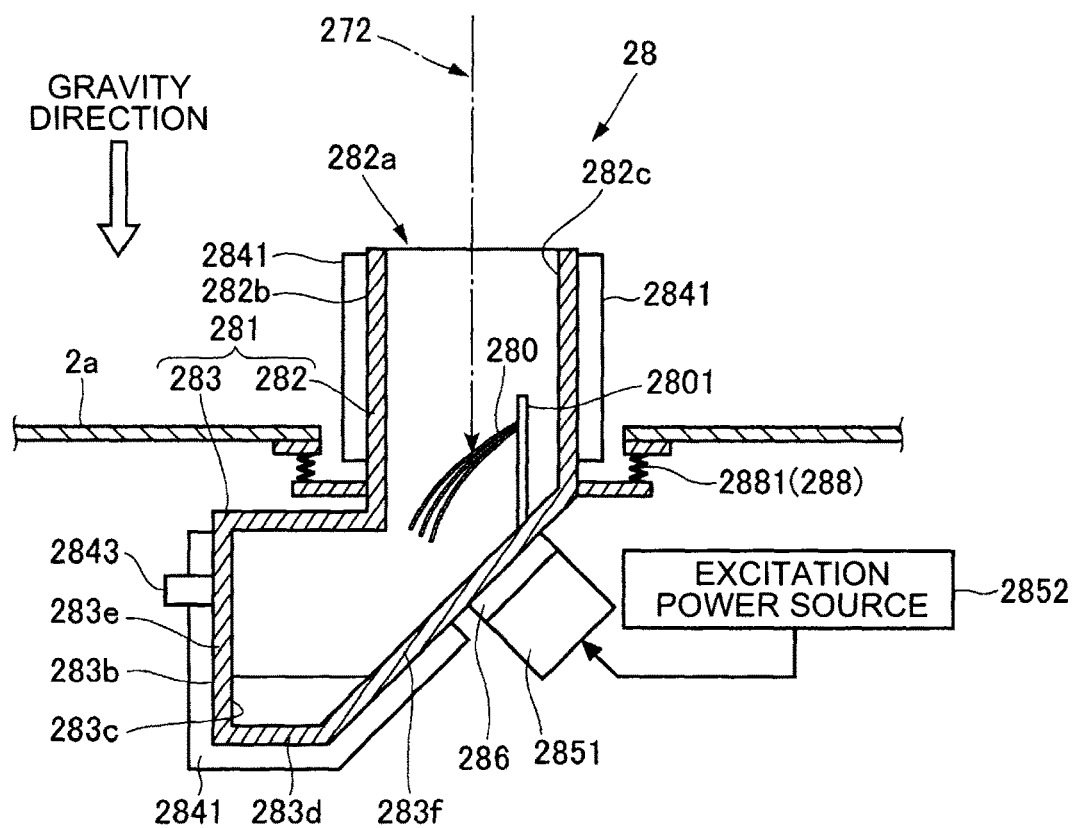
FIG. 20 is a drawing for illustrating a target recovery apparatus provided to an EUV light generation device of a modification 2 of the sixth embodiment.

FIG. 20 is a drawing for explaining the target recovery apparatus 28 provided to the EUV light generation device 1 of the modification 2 of the sixth embodiment.

The recovery container 281 of FIG. 20 may be provided with the holding flange 282e and the connection flange 282f, which is the same as the recovery container 281 illustrated in FIGS. 17 to 18C.

In the recovery container 281, the vibration damping member 288 may not be disposed on a part of the inclined portion 283f of the tank 283, and the recovery container 281 may have a configuration that is the same as the inclined portion 283f illustrated in FIG. 8.

The vibration damping member 288 of FIG. 20 may have a configuration that is the same as the configuration of the vibration damping member 288 illustrated in FIGS. 17 to 18C, and may be disposed between the chamber 2 and the target recovery apparatus 28.

The other part of the configuration of the target recovery apparatus 28 according to the modification 2 of the sixth embodiment may be the same as that of the target recovery apparatus 28 according to the modification 2 of the fifth embodiment.

With this configuration, the vibration damping member 288 can suppress transmission of vibration of the excitation device 2851 and the receiver 280 to the chamber 2 and the target supply device 26.

Consequently, the target recovery apparatus 28 of the modification 2 of the sixth embodiment can suppress disturbance of the target trajectory 272 caused by the chamber 2 and the target supply device 26 being vibrated.

12. Target Recovery Apparatus Provided to EUV Light Generation Device of Seventh Embodiment A target recovery apparatus 28 provided to an EUV light generation device 1 of a seventh embodiment will be described with reference to FIG. 21.

In the EUV light generation device 1 of the seventh embodiment, a direction of deriving the EUV light 252 from the chamber 2 to the exposure device 6 may be inclined with respect to the horizontal direction. As such, the chamber 2 in a substantially cylindrical shape may be disposed such that the central axis direction thereof is inclined with respect to the horizontal direction.

The target supply device 26 provided on a side face portion of the chamber 2 may output the target 27 such that the target trajectory 272 is inclined with respect to the gravity direction.

The target recovery apparatus 28 of the seventh embodiment may be disposed on an extended line of the target trajectory 272 inclined with respect to the gravity direction.

Regarding the configuration of the EUV light generation device 1 of the seventh embodiment, description of the configuration that is the same as the configuration of the EUV light generation device 1 of the first to the sixth embodiments is omitted.

[12.1 Configuration]

Figure 21:
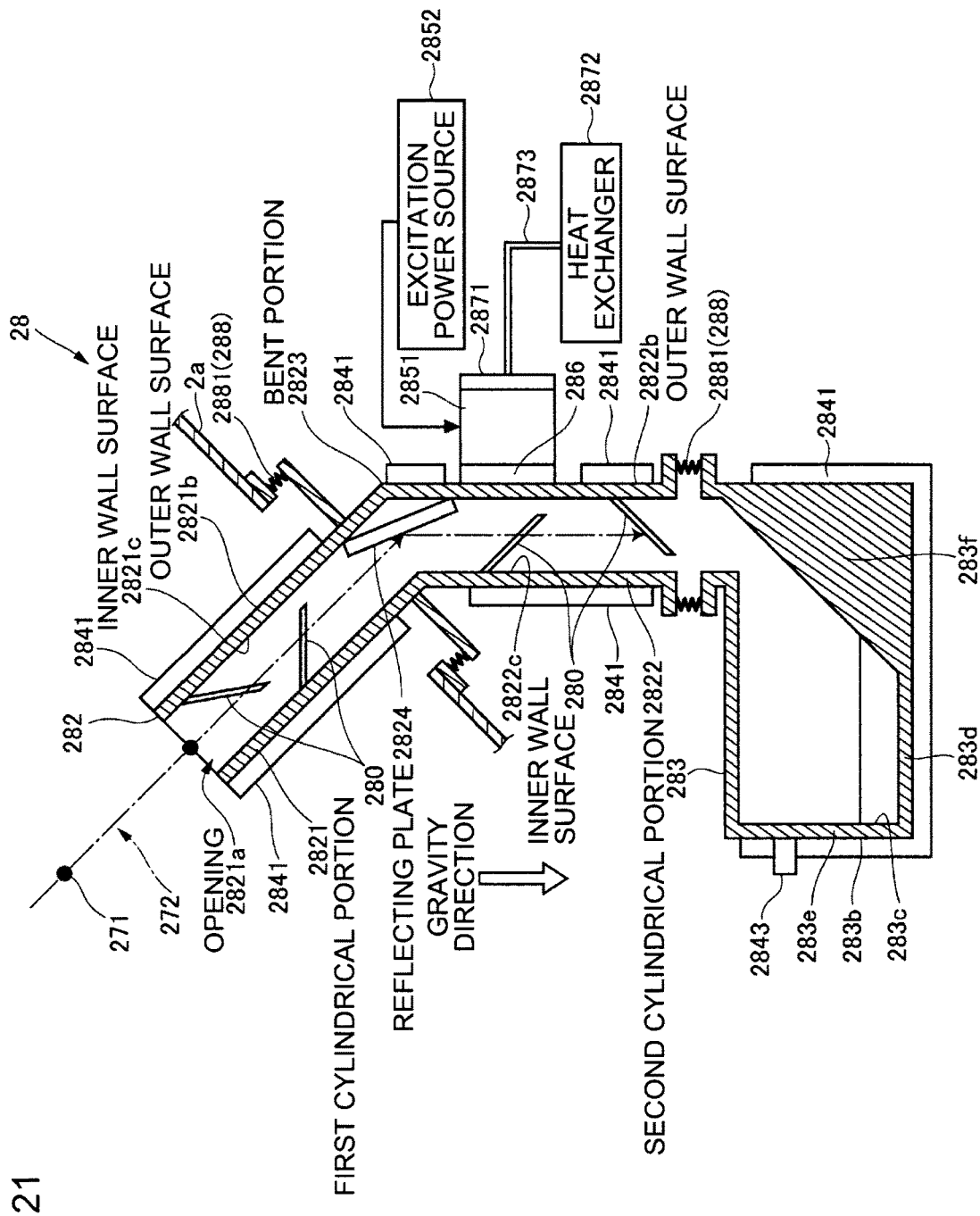
FIG. 21 is a drawing for illustrating a target recovery apparatus provided to an EUV light generation device of a seventh embodiment.

FIG. 21 is a drawing for explaining the target recovery apparatus 28 provided to the EUV light generation device 1 of the seventh embodiment.

In the recovery container 281 of FIG. 21, the cylindrical portion 282 may be bent.

The cylindrical portion 282 may include a first cylindrical portion 2821, a second cylindrical portion 2822, and a bent portion 2823.

The first cylindrical portion 2821 may be a portion of the cylindrical portion 282 located on the inner side of the chamber 2 from the bent portion 2823.

The first cylindrical portion 2821 may be formed such that the central axis thereof extends along the target trajectory 272. The central axis of the first cylindrical portion 2821 may be inclined with respect to the gravity direction.

The first cylindrical portion 2821 may be disposed to penetrate the wall 2a of the chamber 2. An opening 2821a on one end side of the first cylindrical portion 2821 may be located inside the chamber 2. The opening 2821a may be an opening for the target 27, not irradiated with the pulse laser light 33, to enter the recovery container 281. An opening on the other end side of the first cylindrical portion 2821 may be located outside the chamber 2.

The first cylindrical portion 2821 may be integrally formed with the holding flange 282e, which is the same as the cylindrical portion 282 illustrated in FIGS. 17 to 18C. Then, the first cylindrical portion 2821 may be connected with the connection flange 282f fixed to the wall 2a of the chamber 2, via the bellows member 2881, which is the same as the cylindrical portion 282 illustrated in FIGS. 17 to 18C. This means that the first cylindrical portion 2821 may be connected with the wall 2a of the chamber 2 via the bellows member 2881. The chamber 2 and the target recovery apparatus 28 can be connected with each other via the bellows member 2881 that is the vibration damping member 288.

The second cylindrical portion 2822 may be a portion of the cylindrical portion 282 located outside the chamber 2 from the bent portion 2823.

The second cylindrical portion 2822 may be formed such that the central axis thereof extends along the gravity direction. The central axis of the second cylindrical portion 2822 may be inclined with respect to the target trajectory 272.

The second cylindrical portion 2822 may be disposed outside the chamber 2.

The bent portion 2823 may be a portion of the cylindrical portion 282 and a boundary portion between the first cylindrical portion 2821 and the second cylindrical portion 2822.

The bent portion 2823 may be located outside the chamber 2.

The bent portion 2823 may be provided with a reflecting plate 2824 inside thereof.

The reflection surface of the reflecting plate 2824 may reflect the target 27, entering the first cylindrical portion 2821, to the inside of the second cylindrical portion 2822.

The reflecting plate 2824 may be integrally formed with the bent portion 2823.

Further, a portion of the inner wall surface of the bent portion 2823 may function as the reflection surface of the reflecting plate 2824. This means that the inner wall surface of the bent portion 2823 may reflect the target 27, entering the first cylindrical portion 2821, to the inside of the second cylindrical portion 2822.

The tank 283 may be provided with the inclined portion 283f, which is the same as the tank 283 illustrated in FIG. 7.

The tank 283 may be connected with the second cylindrical portion 2822 via the bellows member 2881 that is the vibration damping member 288.

Figure 22:
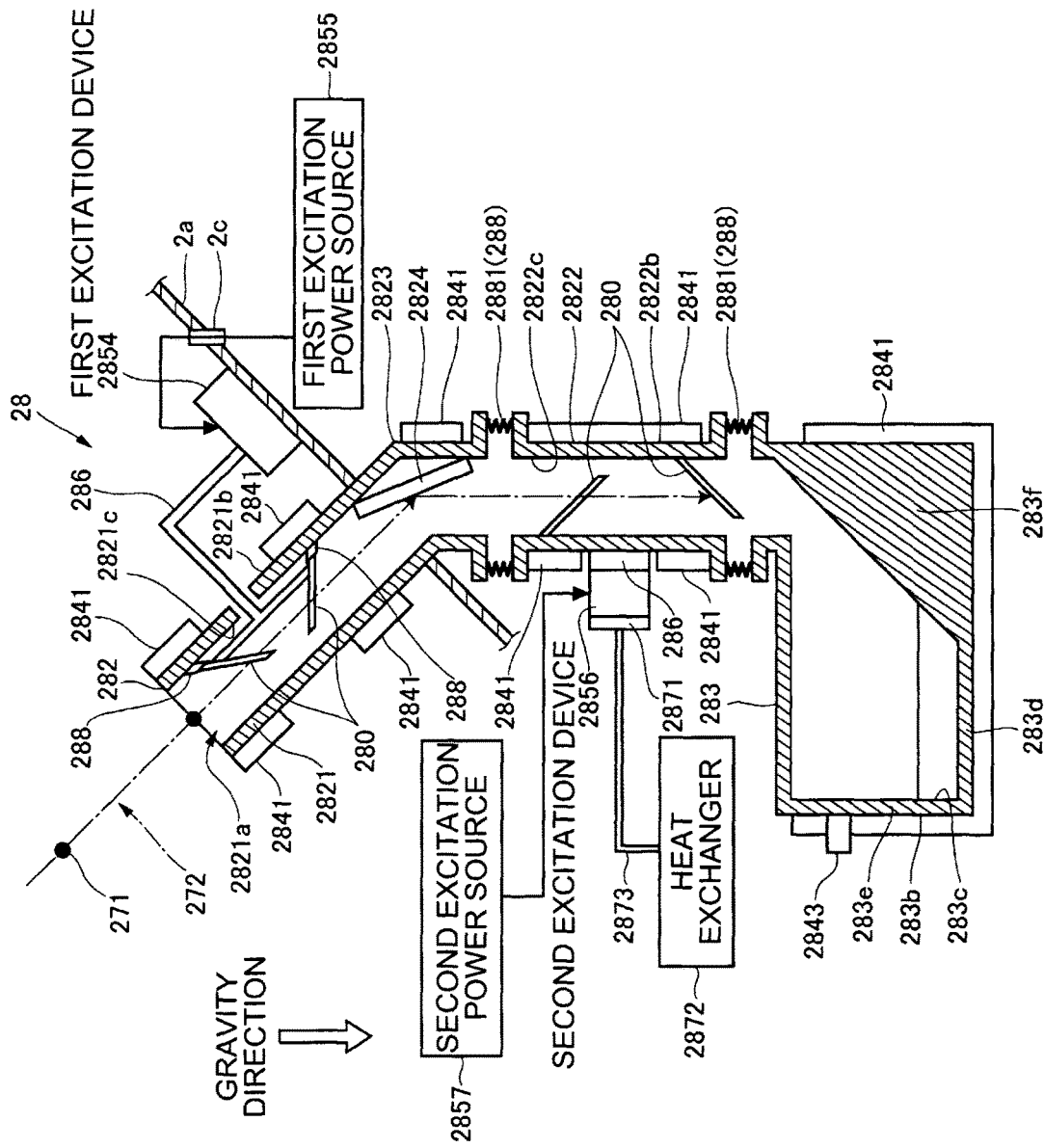
FIG. 22 is a drawing for illustrating a target recovery apparatus provided to an EUV light generation device of a modification 1 of the seventh embodiment.
Figure 23:
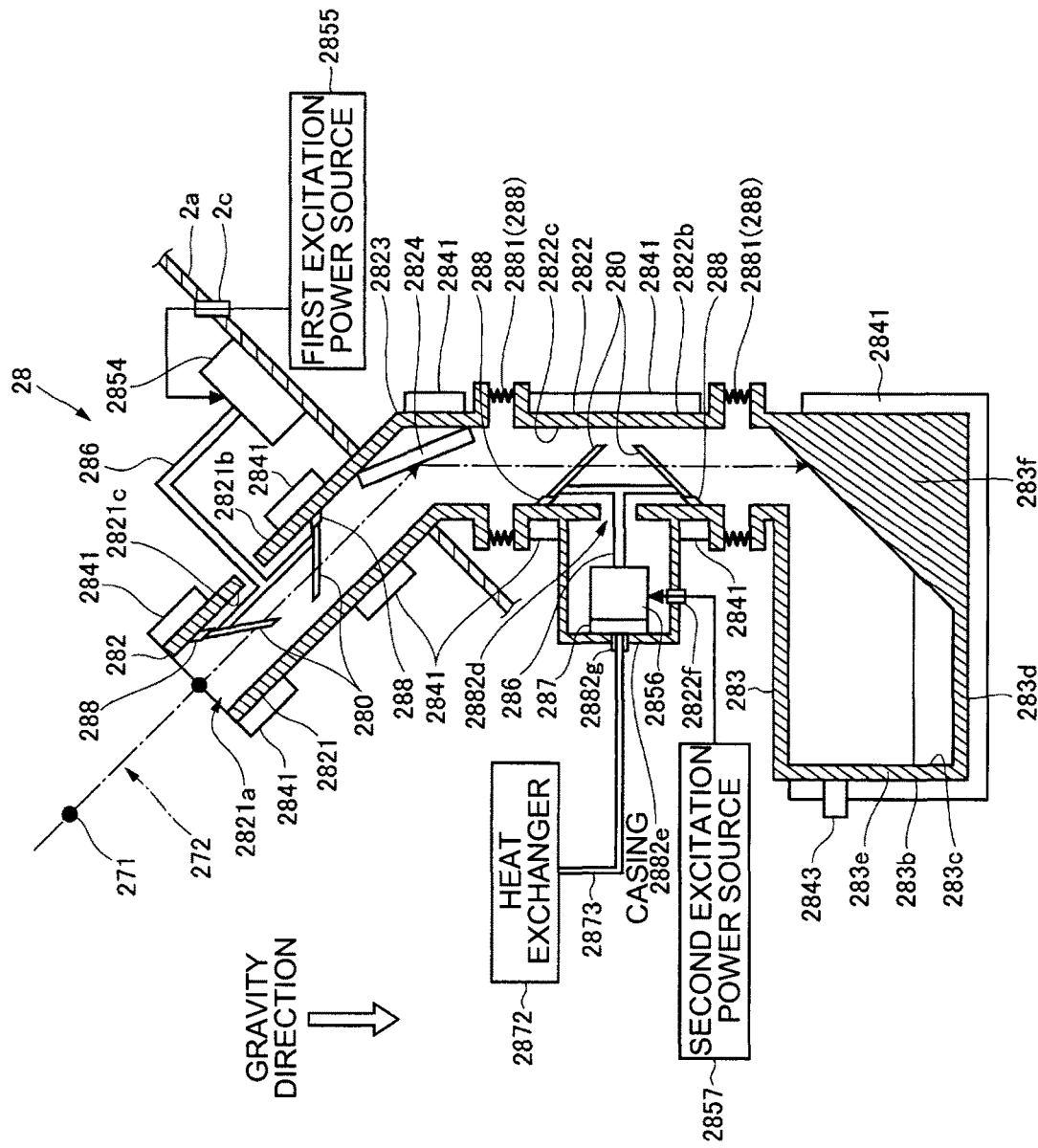
FIG. 23 is a drawing for illustrating a target recovery apparatus provided to an EUV light generation device of a modification 2 of the seventh embodiment.

The receiver 280 of FIG. 21 may be configured using a plate-like member or a fiber member described above. In FIGS. 21 to 23, the receiver 280 configured using a plate-like member described above is illustrated representatively.

A plurality of receivers 280 may be provided in the cylindrical portion 282.

At least one of the receivers 280 may be disposed in the first cylindrical portion 2821. At least one of the receivers 280 may be supported by the inner wall surface 2821c of the first cylindrical portion 2821 located on the inner side of the chamber 2 from the reflecting plate 2824.

Each of the receivers 280 may be directly supported on each of the inner wall surface 2821c of the first cylindrical portion 2821 and the inner wall surface 2822c of the second cylindrical portion 2822, not via a support member. Alternatively, each of the receivers 280 may be supported on each of the inner wall surfaces 2821c and 2822c via a support member that is the same as the support member 2801 described above.

The receivers 280 may be disposed alternately with respect to the central axis of the first cylindrical portion 2821 or the second cylindrical portion 2822.

The excitation device 2851 of FIG. 21 may be connected with the outer wall surface 2822b of the second cylindrical portion 2822 via the heat transfer suppression member 286.

The cooling device 2871 of FIG. 21 may be connected with a surface located opposite to the heat transfer suppression member 286 of the excitation device 2851.

The other part of the configuration of the target recovery apparatus 28 of the seventh embodiment may be the same as that of the target recovery apparatus 28 of the first to the sixth embodiments.

[12.2 Operation]

Operation of the target recovery apparatus 28 according to the seventh embodiment will be described.

Regarding the operation of the target recovery apparatus 28 according to the seventh embodiment, description of the operation that is the same as the operation of the target recovery apparatus 28 of the first to the sixth embodiments is omitted.

The target 27 can travel along the target trajectory 272 inclined with respect to the gravity direction, and enter the first cylindrical portion 2821.

The target 27 entering the first cylindrical portion 2821 may collide with the receiver 280 disposed in the first cylindrical portion 2821, and the kinetic energy can be reduced.

The target 27 that collided with the receiver 280 disposed in the first cylindrical portion 2821 may collide with the reflection surface of the reflecting plate 2824, and the travel direction can be changed. At this time, even if splash is caused due to collision of the target 27 with the reflecting plate 2824, the splash can be prevented from flying to the outside of the recovery container 281 by the receiver 280 disposed in the first cylindrical portion 2821.

The target 27 that collided with the reflection surface of the reflecting plate 2824 can enter the second cylindrical portion 2822.

The target 27 entering the second cylindrical portion 2822 may collide with the receiver 280 disposed inside the second cylindrical portion 2822, and the kinetic energy can be further reduced.

The target 27 that collided with the receiver 280 disposed in the second cylindrical portion 2822 can drop onto the inclined portion 283f of the tank 283, and can be stored in the tank 283 through the inclined portion 283f.

As described above, the excitation device 2851 may vibrate the outer wall surface 2822b of the second cylindrical portion 2822 via the heat transfer suppression member 286 only during the period when the target supply device 26 outputs the target 27. Alternatively, the excitation device 2851 may vibrate the outer wall surface 2822b of the second cylindrical portion 2822 via the heat transfer suppression member 286 during the period when the EUV light 252 is not generated.

The vibration applied to the outer wall surface 2822b of the second cylindrical portion 2822 via the heat transfer suppression member 286 can be transmitted to the second cylindrical portion 2822 and the first cylindrical portion 2821.

The vibration transmitted to the second cylindrical portion 2822 and the first cylindrical portion 2821 can be transmitted to the receiver 280 disposed in the second cylindrical portion 2822 and the receiver 280 disposed in the first cylindrical portion 2821. This means that the excitation device 2851 can vibrate the receivers 280 disposed in the first cylindrical portion 2821 and the second cylindrical portion 2822 via the outer wall surface 2822b of the second cylindrical portion 2822. Thereby, accumulation of the target 27 on the receiver 280 can be suppressed.

Further, the vibration transmitted to the second cylindrical portion 2822 can be attenuated by the vibration damping member 288 between the second cylindrical portion 2822 and the tank 283, and the transmission to the tank 283 can be prevented. The vibration transmitted to the first cylindrical portion 2821 can be attenuated by the vibration damping member 288 between the first cylindrical portion 2821 and the chamber 2, and transmission to the chamber 2 can be prevented.

The other part of the operation of the target recovery apparatus 28 of the seventh embodiment may be the same as that of the target recovery apparatus 28 according to the first to the sixth embodiments.

[12.3 Effect]

The target recovery apparatus 28 of the seventh embodiment can limitedly vibrate the cylindrical portion 282 in which the excitation device 2851 and the receiver 280 are disposed.

This means that the target recovery apparatus 28 of the seventh embodiment can suppress transmission of the vibration of the excitation device 2851 and the receiver 280 to the chamber 2 to which the target recovery apparatus 28 is fixed and the target supply device 26 fixed to the chamber 2.

The target recovery apparatus 28 may be used in a state where the tank 283 is provided on the frame or on the floor surface to which the chamber 2 is mounted.

Even in that case, the target recovery apparatus 28 of the seventh embodiment can limitedly vibrate the cylindrical portion 282. Accordingly, it is possible to suppress transmission of vibration of the excitation device 2851 and the receiver 280 from the tank 283 to the target supply device 26 via the frame or the floor surface.

Consequently, the target recovery apparatus 28 of the seventh embodiment can suppress disturbance of the target trajectory 272 caused by the chamber 2 and the target supply device 26 being vibrated.

[12.4 Modification 1 of Seventh Embodiment]

A target recovery apparatus 28 provided to an EUV light generation device 1 of a modification 1 of the seventh embodiment will be described with reference to FIG. 22.

In the target recovery apparatus 28 according to the modification 1 of the seventh embodiment, configurations of the recovery container 281 and the excitation mechanism 285 may be different from those of the target recovery apparatus 28 of the seventh embodiment.

Regarding the configuration of the EUV light generation device 1 in the modification 1 of the seventh embodiment, description of the configuration that is the same as the configuration of the EUV light generation device 1 of the seventh embodiment is omitted.

FIG. 22 is a drawing for explaining the target recovery apparatus 28 provided to the EUV light generation device 1 of the modification 1 of the seventh embodiment.

In the recovery container 281 of FIG. 22, the first cylindrical portion 2821 may be fixed to the wall 2a of the chamber 2 not via the bellows member 2881.

Further, in the recovery container 281, the second cylindrical portion 2822 may be connected with the bent portion 2823 and the tank 283 via the bellows member 2881, rather than integrally formed with the first cylindrical portion 2821 and the bent portion 2823.

The receiver 280 disposed in the first cylindrical portion 2821, among the receivers 280 of FIG. 22, may be supported on the inner wall surface 2821c of the first cylindrical portion 2821 via the vibration damping member 288.

The receiver 280 disposed in the second cylindrical portion 2822, among the receivers 280, may be directly supported on the inner wall surface 2822c of the second cylindrical portion 2822.

The excitation mechanism 285 of FIG. 22 may include a first excitation device 2854, a first excitation power source 2855, a second excitation device 2856, and a second excitation power source 2857.

The first excitation device 2854 may be a vibrator configured to vibrate the receiver 280 disposed in the first cylindrical portion 2821.

The first excitation device 2854 may be disposed on the inner wall surface of the wall 2a of the chamber 2.

The first excitation device 2854 may be connected with the receiver 280 disposed in the first cylindrical portion 2821 via the heat transfer suppression member 286 passing through the through hole 2821d formed in the first cylindrical portion 2821.

The first excitation power source 2855 may be a power source for supplying electrical power to the motor included in the first excitation device 2854.

The first excitation power source 2855 may be electrically connected with the first excitation device 2854 disposed in the chamber 2 via the feedthrough 2c penetrating the wall 2a of the chamber 2.

The second excitation device 2856 may be a vibrator configured to vibrate the receiver 280 disposed in the second cylindrical portion 2822.

The second excitation device 2856 may be connected with the outer wall surface 2822b of the second cylindrical portion 2822 via the heat transfer suppression member 286.

The second excitation power source 2857 may be a power source for supplying electrical power to the motor included in the second excitation device 2856, and may be electrically connected with the second excitation device 2856.

The cooling device 2871 of the FIG. 22 may be connected with a surface located opposite to the heat transfer suppression member 286 of the second excitation device 2856.

The other part of the configuration of the target recovery apparatus 28 according to the modification 1 of the seventh embodiment may be the same as that of the target recovery apparatus 28 of the seventh embodiment.

With this configuration, in the target recovery apparatus 28 according to the modification 1 of the seventh embodiment, the first cylindrical portion 2821 that is a portion of the cylindrical portion 282 is fixed to the wall 2a of the chamber 2. Accordingly, positioning of the recovery container 281 with respect to the target trajectory 272 can be made easily.

[12.5 Modification 2 of Seventh Embodiment]

A target recovery apparatus 28 provided to an EUV light generation device 1 of a modification 2 of the seventh embodiment will be described with reference to FIG. 23.

In the target recovery apparatus 28 according to the modification 2 of the seventh embodiment, configuration of the receiver 280 disposed in the second cylindrical portion 2822 may be mainly different from that of the target recovery apparatus 28 of the modification 1 of the seventh embodiment.

Regarding the configuration of the EUV light generation device 1 in the modification 2 of the seventh embodiment, description of the configuration that is the same as the configuration of the EUV light generation device 1 of the modification 1 of the seventh embodiment is omitted.

FIG. 23 is a drawing for explaining the target recovery apparatus 28 provided to the EUV light generation device 1 of the modification 2 of the seventh embodiment.

The receiver 280 disposed in the second cylindrical portion 2822, among the receivers 280 of FIG. 23, may be supported on the inner wall surface 2822c of the second cylindrical portion 2822 via the vibration damping member 288.

The second excitation device 2856 of FIG. 23 may be connected with the receiver 280 disposed in the second cylindrical portion 2822 via the heat transfer suppression member 286 passing through the through hole 2822d formed in the second cylindrical portion 2822.

The second excitation device 2856 and the cooling device 2871 may be accommodated in a casing 2822e provided to an outer wall surface 2822b of the second cylindrical portion 2822.

The casing 2822e may be disposed to surround the through hole 2822d.

The inside of the casing 2822e may communicate with the inside of the second cylindrical portion 2822.

The casing 2822e may isolate the inside of the second cylindrical portion 2822 in which the through hole 2822d is formed, from the outside air.

The casing 2822e may be integrally formed with the second cylindrical portion 2822.

The second excitation device 2856 disposed in the casing 2822e may be electrically connected with the second excitation power source 2857 via a feedthrough 2822f penetrating the casing 2822e.

The refrigerant flow path in the cooling device 2871, disposed in the casing 2822e, may communicate with the heat exchanger 2872 by pipe 2873 passing through a feedthrough 2822g penetrating the casing 2822e.

The other part of the configuration of the target recovery apparatus 28 according to the modification 2 of the seventh embodiment may be the same as that of the target recovery apparatus 28 of the modification 1 of the seventh embodiment.

With this configuration, in the target recovery apparatus 28 according to the modification 2 of the seventh embodiment, as the first cylindrical portion 2821 is fixed to the chamber 2, positioning of the recovery container 281 can be made easily, which is the same as the target recovery apparatus 28 of the modification 1 of the seventh embodiment.

13. Others

It will be obvious to those skilled in the art that the techniques of the embodiments described above are applicable to each other including the modifications.

The description provided above is intended to provide just examples without any limitations. Accordingly, it will be obvious to those skilled in the art that changes can be made to the embodiments of the present disclosure without departing from the scope of the accompanying claims.

The terms used in the present description and in the entire scope of the accompanying claims should be construed as terms "without limitations". For example, a term "including" or "included" should be construed as "not limited to that described to include". A term "have" should be construed as "not limited to that described to have".

Moreover, a modifier "a/an" described in the present description and in the accompanying claims should be construed to mean "at least one" or "one or more".

What is claimed is:

1. An extreme ultraviolet light generation device comprising:
   a chamber in which extreme ultraviolet light is generated when a target is irradiated with laser light in a predetermined region inside the chamber;
   a target supply device configured to output the target to the predetermined region in the chamber to thereby supply the target to the predetermined region; and
   a target recovery apparatus configured to recover the target output from the target supply device and not irradiated with the laser light,
   the target recovery apparatus including:
   a receiver disposed to be inclined with respect to a trajectory of the target output from the target supply device, the receiver being configured to receive the target by allowing the target not irradiated with the laser light to collide with the receiver; and
   an excitation device configured to vibrate the receiver.

2. The extreme ultraviolet light generation device according to claim 1, wherein
   the target is made of a metallic material,
   the target supply device melts the target and outputs the target as a droplet to inside of the chamber,
   the target recovery apparatus further includes a heating device configured to heat the receiver such that a temperature of the receiver reaches a temperature equal to or higher than a melting point of the target, and
   the receiver is made of a material on which a contact angle with the melted target is 90° or larger.

3. The extreme ultraviolet light generation device according to claim 2, wherein
   the target recovery apparatus further includes a vibration damping member configured to suppress transmission of vibration to the chamber, the vibration being caused by the excitation device.

4. The extreme ultraviolet light generation device according to claim 3, wherein
   the target recovery apparatus further includes a heat transfer suppression member configured to suppress transfer of heat to the excitation device, the heat being generated by the heating device.

5. The extreme ultraviolet light generation device according to claim 4, wherein
   the target recovery apparatus further includes a cooling device configured to cool the excitation device.

6. The extreme ultraviolet light generation device according to claim 4, wherein
   the receiver is disposed to be inclined with respect to a gravity direction.

7. The extreme ultraviolet light generation device according to claim 4, wherein
   the receiver includes a fiber member.

8. The extreme ultraviolet light generation device according to claim 7, wherein
   the target recovery apparatus further includes a recovery container in which the receiver is disposed, the recovery container being configured to recover the target,
   the receiver is supported on an inner wall surface of the recovery container, and
   the excitation device vibrates the receiver via an outer wall surface of the recovery container.

9. The extreme ultraviolet light generation device according to claim 7, wherein
   the target supply device outputs the target such that the trajectory of the target is inclined with respect to the gravity direction,
   the target recovery apparatus further includes a recovery container in which the receiver is disposed, the recovery container being configured to recover the target,
   the recovery container includes:
   a first cylindrical portion extending along the trajectory, wherein the target not irradiated with the laser light enters through an opening formed at an end of the first cylindrical portion;
   a second cylindrical portion communicating with the first cylindrical portion and extending along the gravity direction;

a reflection surface configured to reflect the target that enters inside the first cylindrical portion to inside of the second cylindrical portion; and a tank communicating with the second cylindrical portion, the tank being disposed outside the chamber and configured to accommodate at least the target that collided with the receiver, and the receiver is disposed at least in the first cylindrical portion.

10. The extreme ultraviolet light generation device according to claim 9, wherein the receiver is supported on at least an inner wall surface of the first cylindrical portion, the excitation device vibrates the receiver via an outer wall surface of the second cylindrical portion, and the first cylindrical portion is connected with a wall of the chamber via the vibration damping member.

11. The extreme ultraviolet light generation device according to claim 9, wherein the first cylindrical portion is fixed to a wall of the chamber, the receiver is supported on at least an inner wall surface of the first cylindrical portion via the vibration damping member, and the excitation device is connected with the receiver via the heat transfer suppression member, the receiver being supported on the inner wall surface of the first cylindrical portion.

\* \* \* \* \*